United States Patent [19]
Futatsuya et al.

[11] Patent Number: 5,999,475
[45] Date of Patent: Dec. 7, 1999

[54] INTERNAL POTENTIAL GENERATION CIRCUIT THAT CAN OUTPUT A PLURALITY OF POTENTIALS, SUPPRESSING INCREASE IN CIRCUIT AREA

[75] Inventors: Tomoshi Futatsuya; Atsushi Ohba, both of Hyogo, Japan

[73] Assignee: Mitsubishi Denki Kabushiki Kaisha, Tokyo, Japan

[21] Appl. No.: 09/034,996

[22] Filed: Mar. 5, 1998

[30] Foreign Application Priority Data

Aug. 27, 1997 [JP] Japan ................................. 9-231241

[51] Int. Cl.$^6$ ................................................. G11C 7/00
[52] U.S. Cl. ............... 365/226; 365/185.23; 365/189.09; 365/189.11
[58] Field of Search .............................. 365/226, 185.23, 365/189.09, 189.11; 327/536

[56] References Cited

U.S. PATENT DOCUMENTS

| | | | |
|---|---|---|---|
| 5,343,434 | 8/1994 | Noguchi | 365/185.23 |
| 5,428,568 | 6/1995 | Kobayashi et al. | 365/185.23 |
| 5,499,209 | 3/1996 | Oowaki et al. | 365/226 |
| 5,617,369 | 4/1997 | Tomishima et al. | 365/230.06 |
| 5,801,987 | 9/1998 | Dinh | 365/185.23 |
| 5,818,289 | 10/1998 | Chevallier et al. | 327/536 |
| 5,828,596 | 10/1998 | Takata et al. | 365/226 |
| 5,892,267 | 4/1999 | Takada | 327/536 |
| 5,909,141 | 6/1999 | Tomishima | 327/536 |

FOREIGN PATENT DOCUMENTS

| | | |
|---|---|---|
| 4-182995 | 6/1992 | Japan. |
| 5-182481 | 7/1993 | Japan. |

*Primary Examiner*—David Nelms
*Assistant Examiner*—Gene N. Auduong
*Attorney, Agent, or Firm*—McDermott, Will & Emery

[57] ABSTRACT

An internal potential generation circuit operates with the potential levels of an output node $N_{H1}$ of a first boosting circuit and an output node $N_{H2}$ of a second boosting circuit maintained in common in response to a high voltage switch circuit attaining a conductive state at the initial stage of the operation of the internal potential generation circuit. After the output potential level of the second boosting circuit arrives at a predetermined potential level, the high voltage switch circuit is cut off, whereby the first and second boosting circuits drive independently the potential level of corresponding output nodes.

13 Claims, 18 Drawing Sheets

|  | BIT LINE | CONTROL GATE | SOURCE LINE | SUBSTRATE |
|---|---|---|---|---|
| WRITING | 5V | -8V | FLOATING | 0V |
| ERASURE | FLOATING | 10V | -8V | -8V |
| READING | 1V | 3V | 0V | 0V |

INTERNAL POTENTIAL GENERATION CIRCUIT THAT CAN OUTPUT A PLURALITY OF POTENTIALS, SUPPRESSING INCREASE IN CIRCUIT AREA

BACKGROUND OF THE INVENTION

1. Field of the Invention

The present invention relates to an internal potential generation circuit mounted in a semiconductor integrated circuit device, and receiving an external power supply potential for generating an internal potential. More particularly, the present invention relates to an internal potential generation circuit that receives an external power supply potential for generating an internal potential required for writing and erasing data with respect to a nonvolatile memory device in a nonvolatile semiconductor memory device and the like.

2. Description of the Background Art

In a semiconductor integrated circuit device, particularly, in a non-volatile semiconductor memory device such as a flash memory, data is written through a tunnel current and the like to a memory cell transistor having a floating gate. It is therefore necessary to generate a voltage higher than the external power supply voltage (for example Vcc=3.3V) on the chip.

When a structure is implemented in which a sense amplifier is commonly shared by left and right bit line pairs such as in a dynamic semiconductor memory device (referred to as DRAM hereinafter) as well as in a nonvolatile semiconductor memory device, a boosted potential of a sufficient high level must be applied to the gate of the transistor for bit line isolation that opens/closes the connection between the sense amplifier and the left and right bit line pairs. If a boosted voltage is not applied, the potential level of the H level (logical high) data written into a memory cell will be reduced by the threshold voltage of the bit line isolation transistor even when the bit line isolation transistor is rendered conductive in a data writing operation to a memory cell or a data rewriting operation in a refresh operation mode.

For example, in a data output circuit, a great current flows to the output transistor. Therefore, an N channel MOS transistor is used to avoid CMOS latch up. In this case, reduction in the charging rate with respect to the load caused by a lower potential corresponding to the threshold voltage of the output transistor must be avoided. It is therefore necessary to drive the gate of the N channel MOS output transistor with a boosted potential.

In a nonvolatile semiconductor memory device such as a flash memory, a negative potential must be applied to the control gate, the source line, and the substrate according to the operation mode in a write operation and an erasure operation, as will be described afterwards.

In general, a negative potential is applied to the substrate side in order to improve the latch up resistance of the CMOS circuit and to suppress threshold value variation of the MOS transistor in a DRAM.

In this case, a negative potential must be generated from an externally applied single power supply potential (for example Vcc=3.3V).

In the above-described cases where an internal potential higher than the external power supply potential or a negative internal potential is to be generated, a charge pump circuit is generally employed.

FIG. 19 is a circuit diagram showing main components of a charge pump circuit 2000 for generating a positive internal high potential.

Charge pump circuit 2000 includes N channel MOS transistors Q1–Q7 connected in series between an output node $N_H$ from which a positive internal high potential is output and a power supply potential Vcc, each transistor being diode-connected, and capacitors C1–C6 having respective ends connected to the gates of transistors Q2–Q7. A clock signal PH is applied to the other ends of capacitors C1, C3 and C5. A clock signal /PH complementary (non-overlapping) to clock signal PH is applied to the other ends of capacitors C2, C4 and C6.

FIG. 20 is a schematic diagram showing a cross section of transistors Q1–Q7 of FIG. 19. A structure equal to a diode with the forward direction from the source to the drain is implemented since the gate electrode and the source are connected.

FIG. 21 shows an equivalent circuit of FIG. 19.

FIG. 22 is a timing chart showing the transition of clock signals PH and /PH over time.

The operation of charge pump circuit 2000 will be described briefly hereinafter with reference to FIGS. 21 and 22.

The potential of the node connected to signals PH and /PH via the capacitor varies in synchronization with these signals.

At time t1 in FIG. 22 when signal PH attains an H level (Vcc level) and signal /PH attains an L level (GND level), the potentials of nodes N1, N3 and N5 have to rise, and the potentials of nodes N2, N4 and N6 have to become lower in response to signals /PH.

However, there is a diode connected respectively between nodes N1 and N2, between nodes N3 and N4, and between nodes N5 and N6. Therefore, a forward current flows from node N1 to node N2 via diode Q2. Similarly, a forward current flows from node N3 to node N4 via diode Q4. Also, a forward current flows from node N5 to node N6 via diode Q6. The potentials of nodes N2, N4 and N6 do not exhibit a great reduction during the period of time t1–t2.

At time t2, signal PH is driven to an L level, and signal /PH is driven to an H level. Likewise the case of time t1–t2, the potential reduction of node N1 does not correspond to the reduction of signal PH due to the current flowing from power supply potential Vcc via diode Q1. Similarly, the potential reduction of nodes N3 and N5 is not so great as the reduction of signal PH due to the current flowing from nodes N2 and N4 via diodes Q3 and Q4, respectively.

By repeating the above operation, a potential of a level sufficiently higher than the level of internal power supply Vcc is output to output node Nh.

The diode of charge pump circuit 2000 of FIG. 19 is formed by the connection of the source and gate of a MOS transistor. Here, the potential difference of boosting is represented by the following equation.

$$\text{(Amplitude of signal applied as a pulse–threshold value of MOS transistor)} \times \text{number of stages} \quad (1)$$

In a steady state, the supply current $I_{OUT}$ provided from charge pump circuit 2000 is represented by the following equation.

$$I_{OUT} = f \times (C + Cs) \times V_t \quad (2)$$

where f is the frequency of the clock signal supplied to the charge pump, C is the sum of the capacitance of coupling capacitors C1–C6, Cs is the parasitic capacitance, and $V_L$ is the voltage amplitude when the coupling capacitor is charged/discharged.

It is appreciated from equation (2) that a greater output current is provided in proportion to a larger sum C of the capacitance of coupling capacitors C1–C6.

In a transition state, the load capacitor can be charged more speedily with a greater output current.

The operation of a nonvolatile semiconductor memory device, for example a flash memory, that operates employing the above internal potential generation circuit will be described hereinafter.

FIGS. 23A and 23B are schematic sectional views of a floating gate type transistor forming the memory cell of a conventional nonvolatile semiconductor memory device. The former shows the case of a writing operation, and the latter shows the case of an erasure operation.

Referring to FIGS. 23A and 23B, a memory cell transistor includes an n type drain region 1502 and an n type source region 1504 formed at the surface of a p type semiconductor substrate 1500, a floating gate 1506 formed on a channel region between drain region 1502 and source region 1504 with a thin tunnel oxide film (for example, film thickness=10 nm) thereunder, and a control gate 1508 layered on floating gate 1506 with an insulation film thereunder.

A bit line BL is connected to drain region 1502. A predetermined potential is selectively applied to source region 1504 via a source line SL (not shown). Source region 1504 alternatively attains a floating state.

The conductance across the source and drain corresponds to the potential applied to the control gate. The channel conductance increases as the potential applied to the control gate becomes higher. More specifically, when the potential of the control gate is increased while a predetermined voltage is applied across the drain and source, the current Ids flowing across the source and drain will also increase.

The level of the control gate potential at which a current Ids begins to flow across the source and drain by increase of the potential of the control gate is called the cell threshold value.

This cell threshold value increases as electrons are accumulated at floating gate 1506 initially attaining an electrically neutral state.

In other words, current will not flow across the source and drain unless a higher voltage is applied to the control gate in proportion to a greater amount of electrons accumulated at floating gate 1506.

Since a floating gate is electrically cut off by an insulation film, information is stored in a nonvolatile manner by the accumulated electrons. The data written in a memory cell can be identified depending upon whether a current flows across the source and drain when a predetermined potential difference, for example each 1V is applied across the source and drain and a constant potential, for example 3V, is applied to control gate 1508.

FIG. 24 shows examples of potentials applied to bit line BL, control gate 1508, source line SL and substrate 1500 for respective cases of writing data into the above-described memory cell, erasing data, and reading out data.

Write Operation

The write operation will be described briefly hereinafter with reference to FIG. 23A and FIG. 24.

Data is written into a memory cell by drawing out the accumulated electrons from floating gate 1506.

The cell threshold value in a write state is set to be at least 0V and not greater than power supply voltage Vcc assuming that power supply voltage Vcc is applied to control gate 1508 in data reading.

In general, the potential level of control gate 1508 in a memory cell of a nonselected state and a selected state is held at 0V and power supply potential Vcc, respectively. When data is written into a selected memory cell with the cell threshold value set as described above, a source-drain current will flow through the floating gate transistor forming that memory cell.

As an example in data writing, the potential of 5V, −8V and 0V is applied to the bit line, the control gate and the substrate, respectively. Source line SL is set at a floating state.

Under the above potential setting electrons, are drawn out from floating gate 1506 to drain region 1502. In other words, the cell threshold value is reduced.

Erasure Operation

The erasure operation will be described hereinafter with reference to FIG. 23B and FIG. 24.

As an example in an erasure operation, control gate 1508, source line SL, and substrate 1500 are set to the potential of 10V, −8V, and −8V, respectively. Bit line BL is set to a floating state.

In this case, electrons are injected into floating gate 1506 from the substrate 1500 side, i.e., from the channel region towards control gate 1508 that is biased positively.

Electrons will be accumulated in floating gate 1506, whereby the cell threshold value increases.

Readout Operation

When the potentials of bit line BL, control gate 1508, source line SL and substrate 1500 are 1V, 3V, and 0V, respectively, in a readout operation, no current will flow across the source and drain when an erased memory cell is selected.

As described above, the cell threshold value can be altered by introducing or drawing out electrons to or from floating gate 1506. By detecting whether current flows to a selected memory cell in a readout operation, the stored data can be read out.

In the above-described data writing, erasing and reading operation in a flash memory, a high voltage of a plurality of different levels is required. More specifically, a voltage of 5V is applied to a bit line in a writing operation and a voltage of 10V is applied to the control gate in an erasure operation on the basis of an external power supply potential of 3V.

If a charge pump circuit corresponding to each case is mounted on the chip of a nonvolatile semiconductor memory device for the purpose of generating various voltages, a greater circuit area is required to result in increase in the entire chip area.

The same applies to the case where a negative potential is to be generated. In the example shown in FIG. 24, only one level of potential, i.e., −8V, is required as the negative potential. However, there is a possibility that a plurality of the levels of this negative potential is required for optimization of the circuit operation.

If a charge pump circuit corresponding to each case is incorporated in a chip in order to generate respective negative potentials, the chip area will be increased.

Japanese Patent Laying-Open No. 5-182481 discloses an erasure operation in which the variation in the threshold value becomes smaller with respect to a memory cell that is below a predetermined threshold value after an erasure pulse is applied in order to reduce the threshold value distribution range of the memory cell in an erasure operation mode as well as to facilitate data rewriting. More specifically, by setting the voltage (for example 10V) applied to the control gate in a memory cell transistor in a writing operation after an erasure operation smaller than the voltage (for example 12V) applied in a normal writing operation mode, the threshold voltage of a memory cell can be gradually altered to improve the controllability of the threshold voltage.

In this case, at least two levels of voltages higher than the external power supply voltage are required.

SUMMARY OF THE INVENTION

In view of the foregoing, an object of the present invention is to provide an internal potential generation circuit that can generate a plurality of required internal potentials while suppressing circuit area.

Another object of the present invention is to provide an internal potential generation circuit that allows a plurality of internal potentials to charge speedily respective corresponding load capacitances.

According to an aspect of the present invention, an internal potential generation circuit receiving an external power supply potential for generating a first predetermined internal potential and a second predetermined internal potential having an absolute value smaller than that of the first predetermined internal potential includes a clock generation circuit, a first charge pump, a second charge pump, a switch circuit, and a control circuit.

The clock generation circuit outputs clock signals complementary to each other. The first charge pump circuit includes a first output node from which the first predetermined internal potential is output. The first charge pump circuit drives the potential of the first output node at a first current supply amount according to the complementary clock signals. The second charge pump circuit includes a second output node from which the second predetermined internal potential is output. The second charge pump circuit drives the potential of the second output node at a second current supply amount that is smaller than the first current supply amount according to the complementary clock signals. The switch circuit sets the connection between the first output node and the second output node in a conducting state or a cutoff state.

The control circuit controls the supply of complementary clock signals to the first and second charge pump circuits according to the potential level of the first and second output nodes. The control circuit drives the switch circuit to a cutoff state from a conducting state in response to the potential of the first and second output nodes attaining the second predetermined potential.

The main advantage of the present invention is that the potentials of the output nodes of the first and second charge pump circuits are maintained in common until the potentials of the first and second output nodes attain the level of the second predetermined potential. Therefore, even when the current supply amount of the first and second charge pump circuits differ, the load can be charged speedily with a common rising rate of the potential levels of the first and second output nodes.

Thus, increase in the circuit area can be suppressed even when the internal potential generation circuit has to generate a first predetermined internal potential and a second predetermined internal potential.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 24 shows the potential level in a writing operation, erasure operation, and a readout operation for a conventional non-volatile semiconductor memory device.

DESCRIPTION OF THE PREFERRED EMBODIMENTS

FIRST EMBODIMENT

Figure 1:
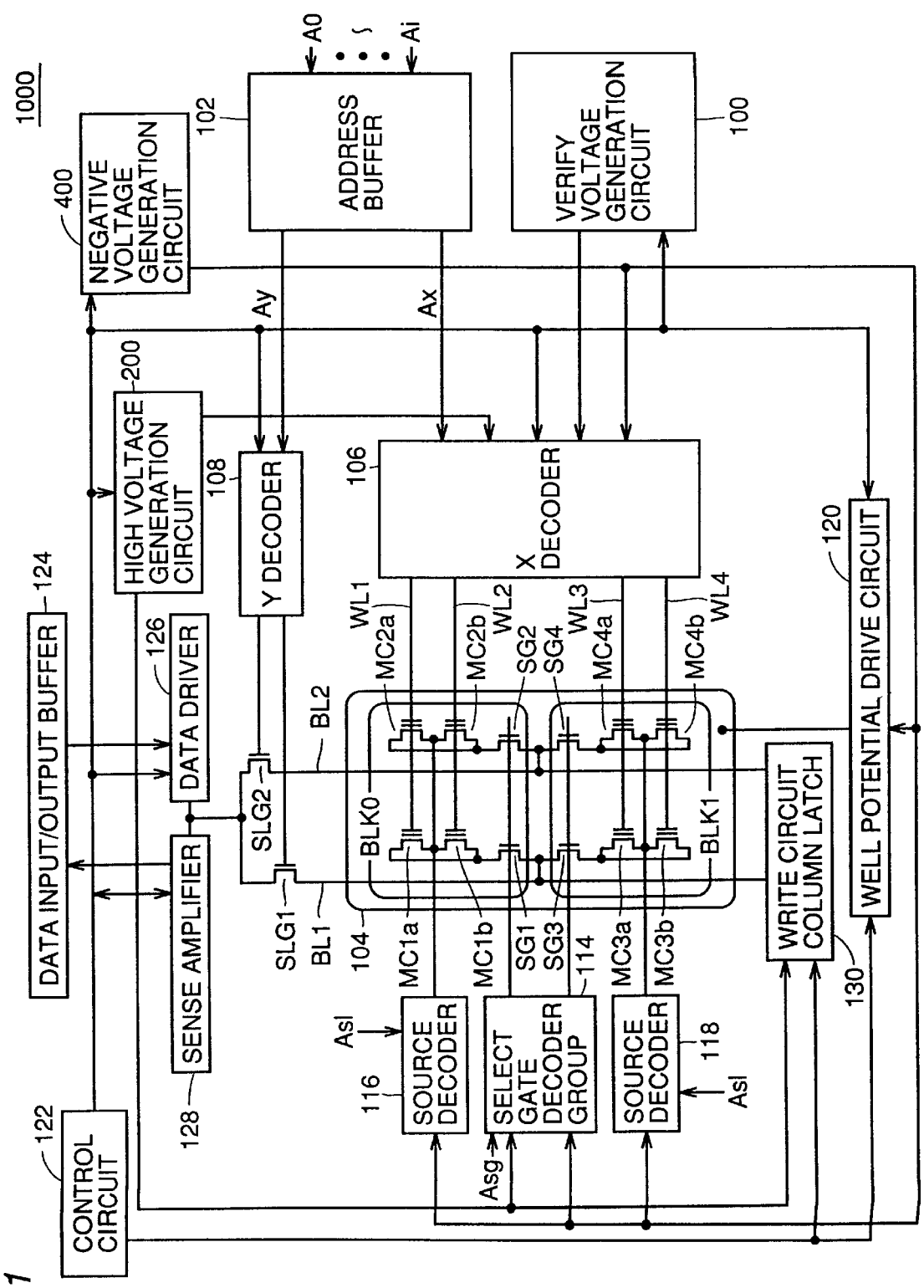
FIG. 1 is a schematic block diagram showing a structure of a nonvolatile semiconductor memory device 1000 according to a first embodiment of the present invention.

Referring to FIG. 1, a nonvolatile semiconductor memory device 1000 according to a first embodiment of the present invention includes an address buffer 102 receiving external address signals A0–Ai for providing corresponding internal column address signal Ay and internal row address signal Ax, a source address As1 signal, and a select gate address signal Asg, a memory cell array 104 in which memory cells are arranged in a matrix, an X decoder 106 for receiving an internal row address signal Ax from address buffer 102 for selecting a corresponding row (word line) in memory cell array 104, and a Y decoder 108 receiving an internal column address signal Ay from address buffer 102 for selecting a corresponding column in memory cell array 104.

Memory cell array 104 includes two memory cell array blocks BLK0 and BLK1. In the example shown in FIG. 1, each of memory cell array blocks BLK0 and BLK1 includes four memory cell transistors. Memory cell array block BLK0 includes memory cell transistors MC1a and MC1b having their drains connected to a sub bit line SBL1, memory cell transistors MC2a and MC2b having their drains connected to a sub bit line SBL2, a select gate SG1 for opening/closing the connection with main bit line BL1 and sub bit line SBL1, and a select gate SG2 for opening/closing the connection with a main bit line BL2 and a sub bit line SBL2.

The control gates of memory cell transistors MC1a and MC2a are both connected to a word line WL1. The control gates of memory cell transistors MC1b and MC2b are connected to a word line WL2.

Similarly, memory cell array block BLK1 includes memory cell transistors MC3a and MC3b having respective drains connected to a sub bit line SBL3, and memory cell transistors MC4a and MC4b having respective drains connected to a sub bit line SBL4.

Memory cell array block BLK1 further includes a select gate SG3 for opening/closing the connection with main bit line BL1 and sub bit line SBL3, and a select gate SG4 for opening/closing the connection with main bit line BL2 and sub bit lie SBL4.

The control gates of memory cell transistors MC3a and MC4a are connected to a word line WL3. The control gates of memory cell transistors MC3b and MC4b are connected to word line WL4.

X decoder 106 selects any one of corresponding word lines WL1–WL4 according to internal row address signal Ax from address buffer 102.

Non-volatile semiconductor memory device 1000 further includes a high voltage generation circuit 200 receiving an external power supply voltage Vcc for generating a high voltage required for a writing or erasing operation of data with respect to a memory cell, a negative voltage generation circuit 400 receiving external power supply voltage Vcc for generating a negative voltage required for a writing or erasing operation with respect to a memory cell, a select gate decoder 114 receiving outputs of high voltage generation circuit 200 and negative voltage generation circuit 112 for controlling the gate potential of a corresponding one of select gates SG1–SG4 according to a signal Asg to selectively connect a sub bit line with a main bit line, a source decoder 116 receiving an output of negative voltage generation circuit 400 for selectively applying a predetermined source potential to the source of a memory cell transistor according to a signal As1, and a well potential drive circuit 120 receiving an output of negative voltage generation circuit 400 for controlling the well potential at the surface of the semiconductor substrate where a memory cell transistor is formed.

X decoder 106 receives an output of high voltage generation circuit 200 and negative voltage generation circuit 112 for supplying a predetermined negative voltage to a selected word line in a write operation and a high voltage to a selected word line in an erasure operation.

Nonvolatile semiconductor memory device 1000 further includes a write/erase control circuit 122 for controlling the write operation and erasure operation with respect to a memory cell, a data input/output buffer 124 for receiving internal data which is provided to an internal circuit or receiving data read out from a memory cell which is output, a data driver 126 receiving a write data applied to data input/output buffer 124 for driving a corresponding bit line potential, a sense amplifier 128 for providing a corresponding readout data according to the stored information in a selected memory cell via bit line BL1 or BL2 in reading out data, a write circuit 130 for receiving and maintaining the write data from data driver 126 for applying a high voltage from high voltage generation circuit 110 to a corresponding bit line, and a verify voltage generation circuit 100 for supplying a verify potential VPVRF to X decoder 10 in a verify operation mode.

This verify operation refers to an operation of confirming whether the memory cell threshold value attains a predetermined potential level when data is written into a memory cell.

Data driver 126 and sense amplifier 128 are connected to bit line BL1 and bit line BL2 via column select gate SLG1 and column select gate SLG2, respectively. The gate potentials of select gates SLG1 and SLG2 are controlled by Y decoder 108. Therefore, a selected bit line is connected to sense amplifier 128 or data driver 126 according to internal column address signal Ay from address buffer 102.

The reason why the bit line is provided in a hierarchical structure of a main bit line and a sub bit line is set forth in the following.

In a structure where memory cell transistors MC1a and MC1b in memory cell array block BLK0 and memory cell transistors MC3a and MC3b of memory cell array block BLK1 are simultaneously connected to one bit line BL1, a high voltage will be applied even to the drain of the memory cell transistors in memory cell array blocks BLK1 when data is to be written only to the memory cells in memory cell array block BLK0. This means that, in the writing phase of data into an adjacent memory cell array block BLK0, the load in the floating gate of a memory cell transistor in memory cell array block BLK1 may be altered. There is a possibility that the written data is changed in the worst case.

To avoid the above problem, separate bit lines should be provided for each memory cell array block that carries out data writing. More specifically, a two-layered structure of main bit lines BL1 and BL2 and sub bit lines SBL1–SBL4 is implemented. The main bit line connects all the memory cell array blocks, and the memory cell transistors in each memory cell array block is connected by sub bit lines SBL1–SBL4.

Select gates SG1–SG4 are provided between main bit lines BL1, BL2 and sub bit lines SBL1–SBL4. In a writing operation, the memory cell array block that is not selected is electrically disconnected from the main bit line by an appropriate select gate.

Thus, a memory cell transistor in a memory cell array block will not be affected by the writing operation of a memory cell transistor in another memory cell array block.

The structure of high voltage generation circuit 200 or negative voltage generation circuit 400 in nonvolatile semiconductor memory device 1000 of FIG. 1 will be described in detail hereinafter.

Figure 2:
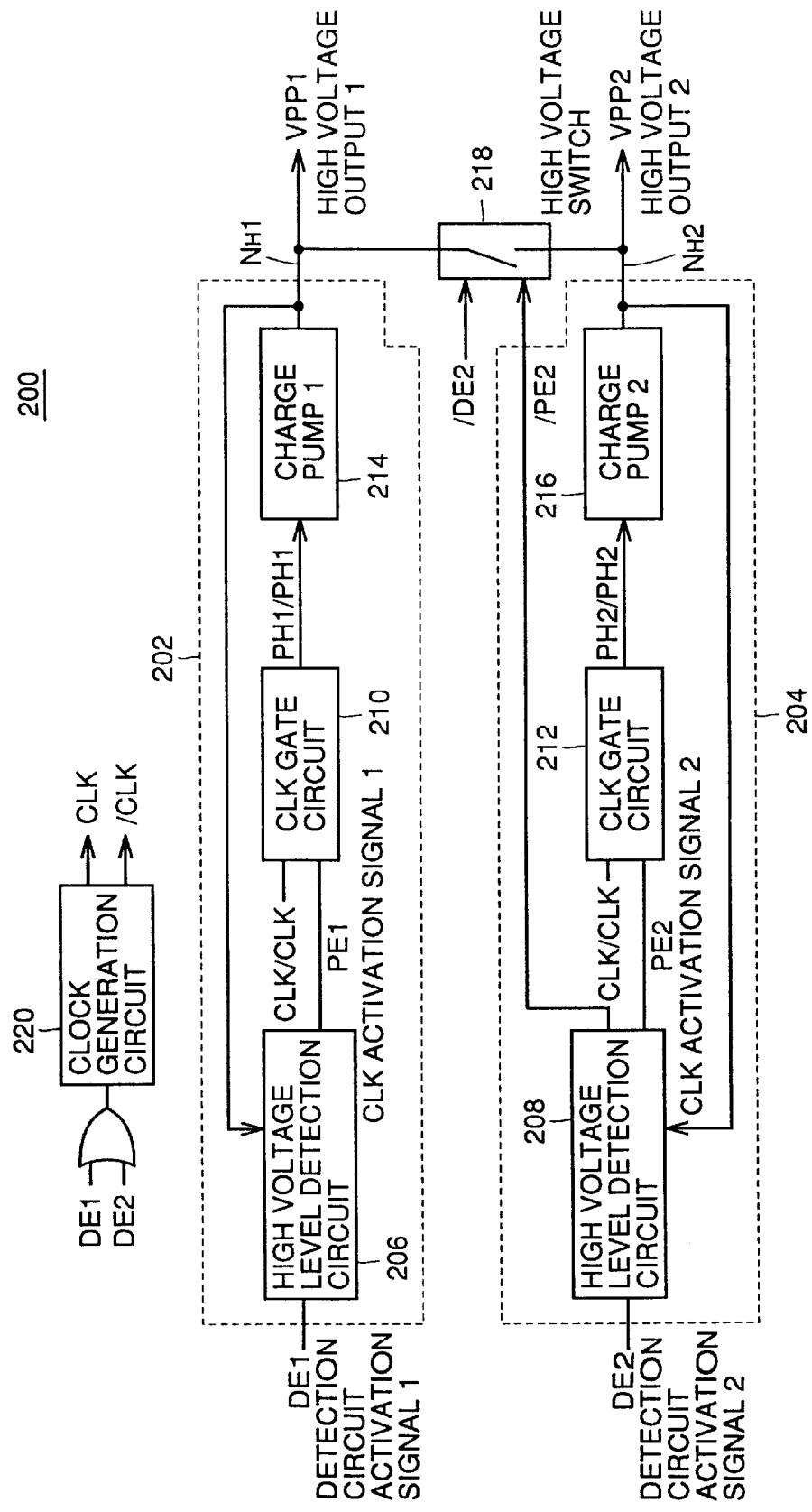
FIG. 2 is a schematic block diagram of a structure of a high voltage generation circuit 200 of the first embodiment.

Referring to FIG. 2, high voltage generation circuit 200 includes a first boosting circuit 202 for providing a boosted potential Vpp1 to an output node $N_{H1}$ under control of control circuit 122 of FIG. 1, a second boosting circuit 204 for providing a second boosted potential Vpp2 to a second output node $N_{H2}$ under control of control circuit 122, a high voltage switch circuit 218 for setting the connection between first and second output nodes $N_{H1}$ and $N_{H2}$ to a conducting state or a cutoff state under control of control circuit 122 and second boosting circuit 204, and a clock generation circuit 220 for providing clock signals CLK and /CLK complementary to each other according to initiation of the operation of high voltage generation circuit 200.

First boosting circuit 202 includes a high voltage level detection circuit 206 initiating an operation according to a first detection circuit activation signal DE1 from control circuit 122 to render a first clock activation signal PE1 active or inactive according to a potential level Vpp1 output to first output node $N_{H1}$, a clock gate circuit 210 receiving clock signals CLK and /CLK for providing first drive clock signals PH1 and /PH1 complementary to each other and under control of signal PE1, and a first charge pump circuit 214 driven by signals PH1 and /PH1 for providing potential Vpp1 to output node $N_{H1}$.

Second boosting circuit 204 includes a high voltage level detection circuit 208 for initiating an operation under control of a second detection circuit activation signal DE2 output from control circuit 122 for providing second clock activation signals PE2 and /PE2 complementary to each other, according to potential Vpp2 output at output node $N_{H2}$, a clock gate circuit 212 receiving clock signals CLK and /CLK for providing second drive clock signals PH2 and /PH2 complementary to each other under control of signal PE2, and a second charge pump circuit 216 driven by signals PH2 and /PH2 for providing a potential Vpp2 to output node $N_{H2}$.

High voltage switch circuit 218 is controlled by complementary signals DE2 and /DE2 and signal /PE2 output from high voltage level detection circuit 208 to set the connection between output nodes $N_{H1}$ and $N_{H2}$ conducting at initiation of an operation by high voltage generation circuit 200 and to set the connection between first and second output nodes $N_{H1}$ and $N_{H2}$ to a cutoff state in response to second output node $N_{H2}$ attaining a predetermined potential level.

Figure 19:
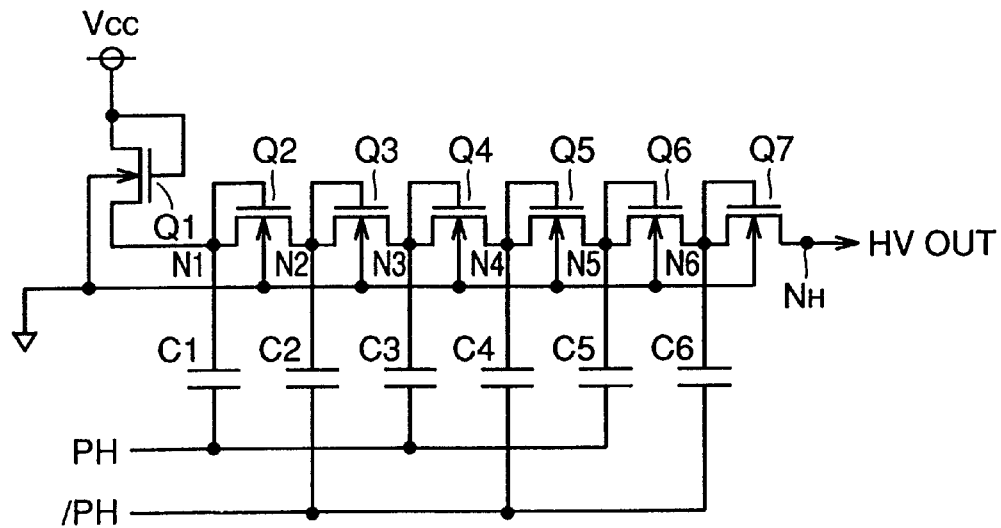
FIG. 19 is a circuit diagram showing a structure of a conventional charge pump circuit 2000.
Figure 20:
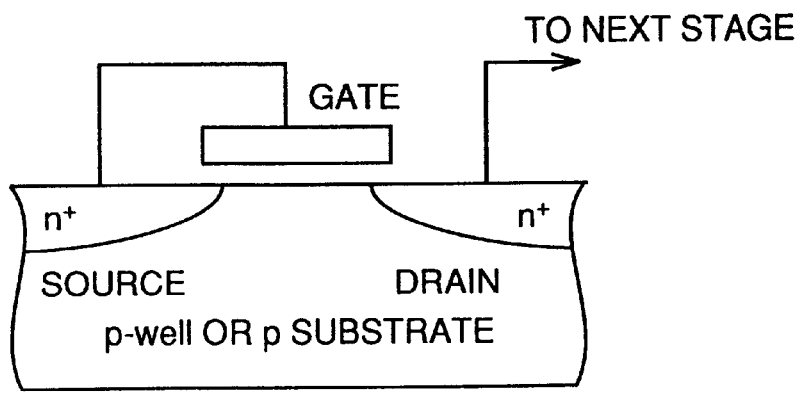
FIG. 20 is a schematic cross section view of a transistor in conventional charge pump circuit 2000.
Figure 21:
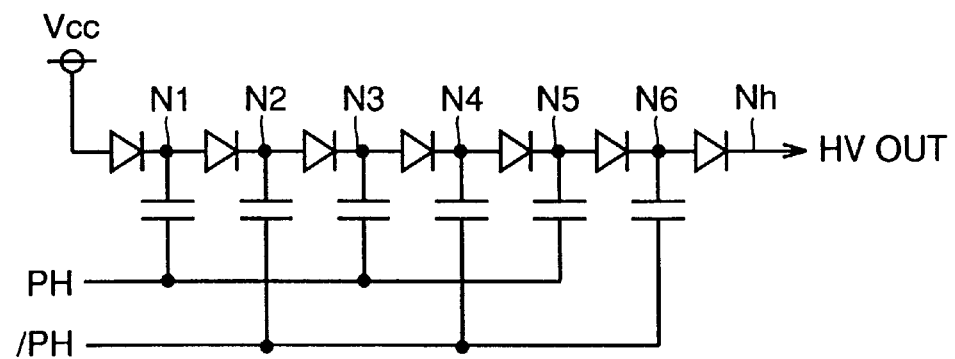
FIG. 21 is a circuit diagram showing an equivalent circuit of conventional charge pump circuit 2000.
Figure 22:
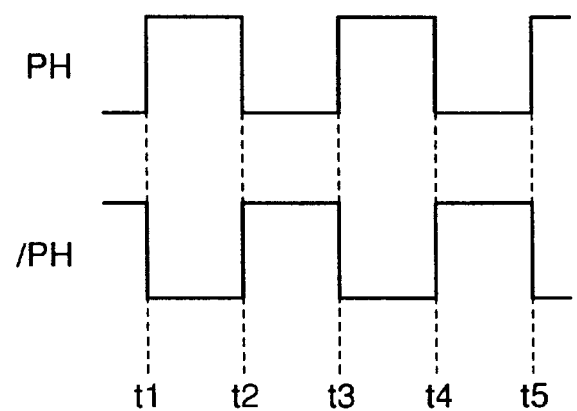
FIG. 22 is a timing chart showing the transition of drive clock signals PH and /PH over time.
Figure 23B:
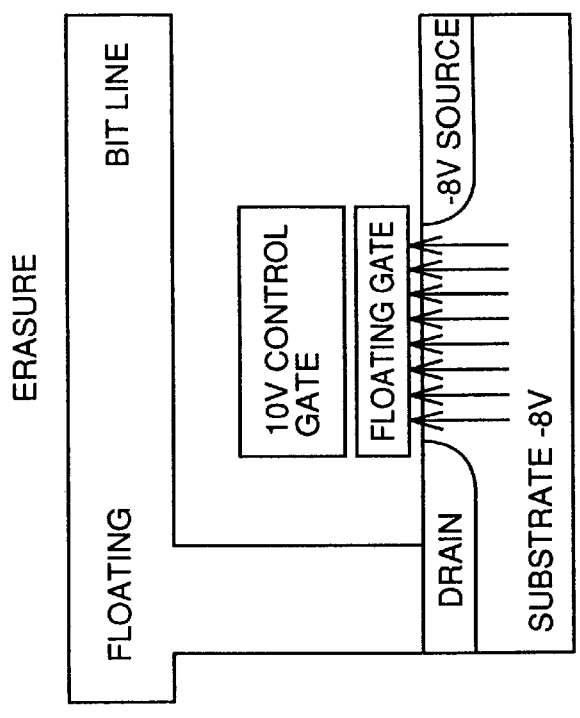
FIGS. 23A and 23B are schematic sectional views of a structure of a memory cell transistor in a conventional non-volatile semiconductor memory device for describing the potential of each component in a write operation (A) and in an erasure operation (B).
Figure 23A:
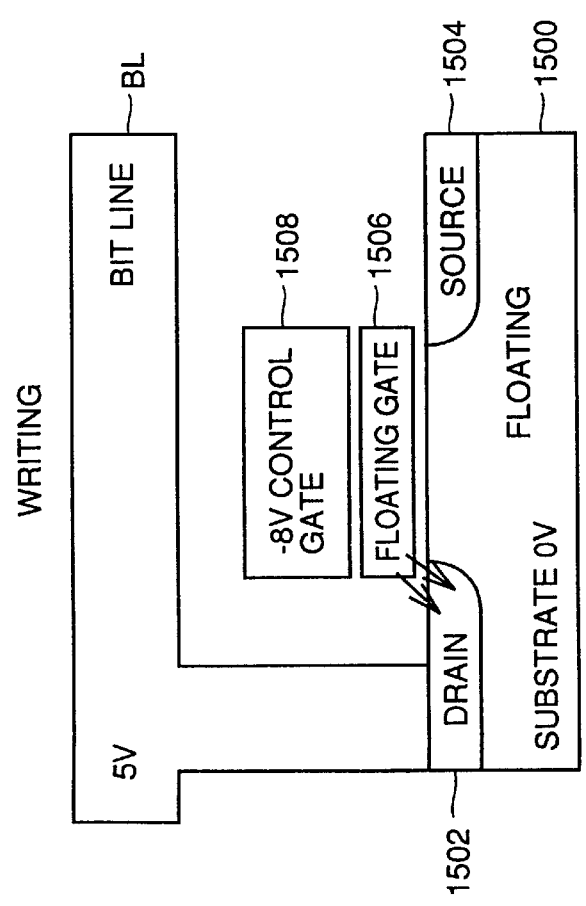

Here, it is assumed that first charge pump circuit 214 has a structure similar to that of the conventional charge pump circuit 2000 shown in FIG. 19. Second charge pump circuit 216 has a number of stages of diode-connected transistors connected in series, fewer in number than those of first charge pump circuit 214.

More specifically, the amount of supply current of second charge pump circuit 216 is smaller than the amount of supply current of first charge pump circuit 214 according to equation (2).

Clock generation circuit 220 responds to activation of signal DE1 or DE2 to initiate an operation to output clock signals CLK and /CLK.

High voltage level detection circuit 206 and high voltage level detection circuit 208 of FIG. 2 have a similar structure, provided that the input signal differs. Therefore, the structure of high voltage detection circuit 206 will be described hereinafter with reference to FIG. 3.

High voltage level detection circuit 206 includes resistors R1 and R2 connected to each other in series between a potential Vpp1 and the ground potential. A potential Vmon of a level having potential Vpp1 divided by the resistance ratio of resistors R1 and R2 is output from a connection node N1 of resistors R1 and R2.

High voltage level detection circuit 206 further includes a current mirror type differential amplifier circuit 2062 activated in response to activation of signal DE1 (transition to an H level), and receiving a predetermined reference potential Vref and potential Vmon for amplifying the potential difference therebetween, a p channel MOS transistor Q16 connected between an output node N2 of current mirror type differential amplifier circuit 2062 and power supply potential Vcc, and rendered conductive according to inactivation of signal DE1 (transition to an L level), and a p channel MOS transistor Q17 and N channel MOS transistors Q18 and Q19 connected in series between power supply potential Vcc and ground potential.

Transistors Q17 and Q18 have their gates both connected to a node n2. The gate of transistor Q19 is supplied with potential Vref.

High voltage level detection circuit 206 further includes an n channel MOS transistor Q20 connected between a connection node N3 of transistors Q17 and Q18 and the ground potential, rendered conductive in response to inactivation (transition to H level) of signal /DE1, and an inverter 2064 having an input node connected to node n3 for providing signal PE1.

The potential of node n3 is output as signal /PE1. The operation of high voltage level detection circuit 206 will be described hereinafter.

During the inactivation state (L level) of signal DE1, transistor Q15 in differential amplifier circuit 2062 is cut off. Differential amplifier 2062 is inactive. Transistor Q20 is rendered conductive in response to signal /DE1 attaining an inactive state (H level), whereby node n3 attains an L level. In response, signal PE1 output from inverter 2064 attains an H level, and signal /PE1 attains an L level.

When signal DE1 is rendered active (H level), differential amplifier circuit 2062 is driven to an active state. In response, signals PE1 and /PE1 output from high voltage level detection circuit 206 shows a transition as set forth in the following according to the comparison of reference potential Vref and potential Vmon.

i) When potential Vmon is greater than reference potential Vref

Since signal DE1 attains an active state (H level), transistor Q16 is cut off. Therefore, the potential of output node n2 of differential amplifier circuit 2062 is driven to an L level. In response, transistor Q17 attains a conducting state and transistor Q18 attains a cutoff state. Therefore, the potential of node n3 attains an H level. Accordingly, signals PE1 and /PE1 output from inverter 2064 attain an L level and an H level, respectively.

ii) When potential Vmon is lower than reference potential Vref

In this case, output node n2 of differential amplifier circuit 2062 attains an H level. In response, transistor Q17 attains a cutoff state and transistor Q18 attains a conducting state. Transistor Q19 conducts since the gate thereof is supplied with reference potential Vref. Therefore, the potential of node n3 is driven to an L level.

Thus, signal PE1 output from inverter 2064 attains an H level, and signal /PE1 is driven to an L level.

More specifically, an active CLK activation signal PE1 is output from high voltage level detection circuit 206 when the level of potential Vpp1 output from output node $N_{H1}$ of boosting circuit 202 becomes lower than a predetermined value.

Figure 4:
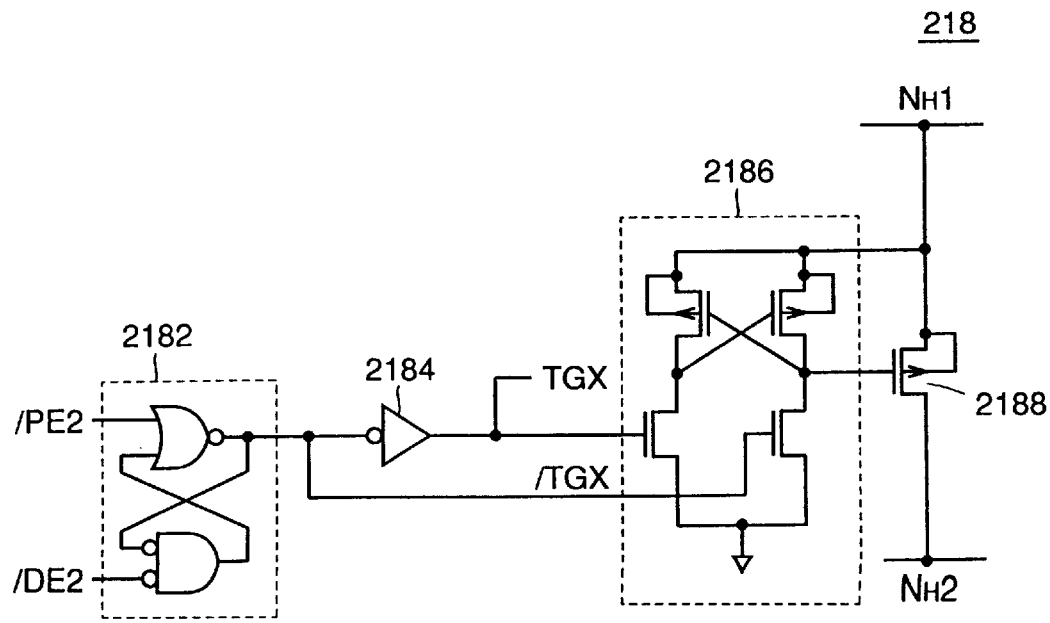
FIG. 4 is a schematic block diagram showing a structure of a high voltage switch circuit 218.

FIG. 4 schematically shows high voltage switch circuit 218 of FIG. 2.

High voltage switch circuit 218 includes a flip-flop circuit 2182 receiving signal /PE2 as a set signal and signal /DE2 as a reset signal, an inverter 2184 receiving an output signal /TGX from flip-flop circuit 2182 to output an inverted signal TGX, a p channel MOS transistor 2188 for rendering the connection between output node $N_{H1}$ of first boosting circuit 202 and output node $N_{H2}$ of second boosting circuit 204 conductive or cut off, and a level conversion circuit 2186 for controlling the gate potential level of p channel MOS transistor 2188 under control of signals TGX and /TGX.

The back gate of p channel MOS transistor 2188 is connected to output node $N_{H1}$.

When signal TGX attains an L level and signal /TGX attains an H level, level conversion circuit 2186 applies the potential of an L level (ground potential) to the gate of p channel MOS transistor 2188. During the period of signal TGX attaining an H level (signal /TGX attains an L level), the potential of node $N_{H1}$ is supplied to the gate of p channel MOS transistor 2188.

The operation of high voltage switch circuit 218 will be described hereinafter.

i) When signal DE2 attains an L level and signal PE2 attains an H level

As described with reference to FIG. 3, signal PE2 attains an H level in high voltage level detection circuit 208 during the period of signal DE2 attaining an inactive state (L level).

In this case, flip-flop circuit 2182 receives signal /PE2 of an L level and signal /DE2 of an H level. Therefore, signal /TGX output from flip-flop circuit 2182 attains an H level. P channel MOS transistor 2188 under control of level shift circuit 2186 attains a conductive state.

Therefore, the conducting state of output node $N_{H1}$ of first boosting circuit 206 and output node $N_{H2}$ of second boosting circuit 204 is maintained.

ii) When signal DE2 attains an H level

Figure 3:
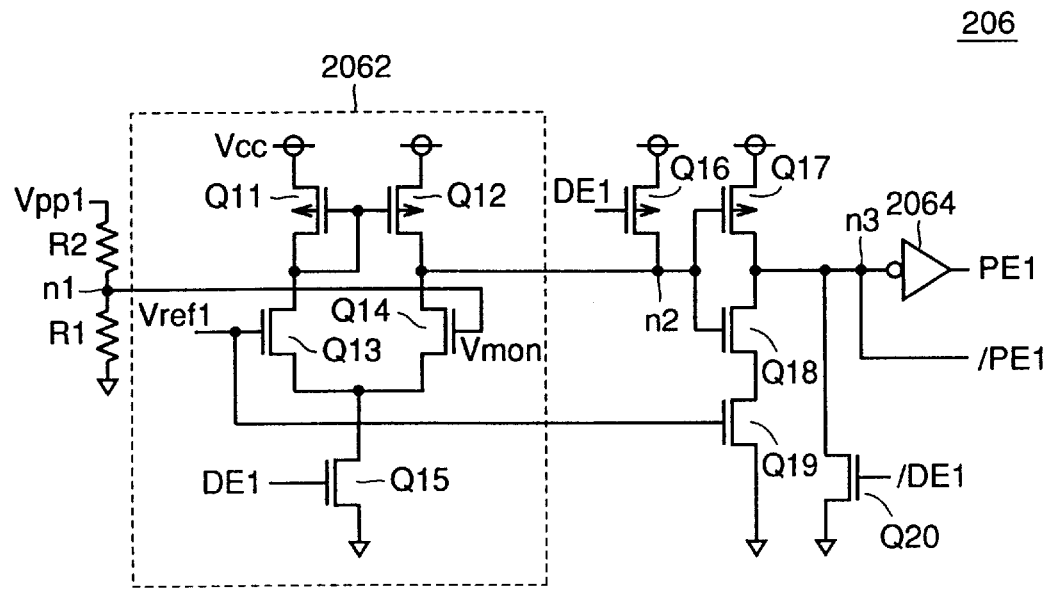
FIG. 3 is a circuit diagram showing a structure of a high voltage level detection circuit 206.

In this case, the level of potential Vmon is initially lower than reference potential Vref in high voltage level detection circuit 206 shown in FIG. 3. Therefore, when signal DE2 attains an H level and high voltage level detection circuit 208 is rendered active, signal PE2 attains an H level.

Therefore, flip-flop circuit 2182 shows no change, and signal /TGH maintains the H level.

In other words, transistor 2188 is still conductive.

When signal PE2 is driven to an L level and signal /PE2 is driven to an H level, the potential applied to the gate of p channel MOS transistor 2188 from level conversion circuit 2186 becomes equal to the potential level of node $N_{H1}$, whereby p channel MOS transistor 2188 is cutoff.

As long as signal DE2 maintains the H level, the level of the potential output from flip-flop circuit 2182 does not change, so that p channel MOS transistor 2188 maintains the cutoff state thereafter independent of the potential level of signal PE2.

Figure 5:
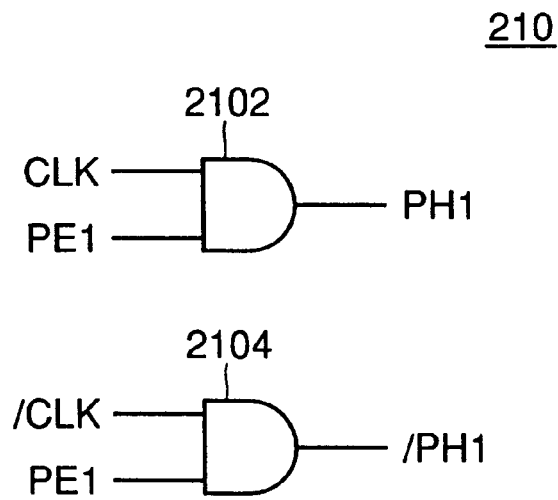
FIG. 5 is a schematic block diagram showing a structure of a CLK gate circuit 210.

FIG. 5 schematically shows a structure of CLK gate circuit 210 of FIG. 2.

CLK gate circuit 212 has a structure basically similar to that of CLK gate circuit 210, provided that the input and output signals differ.

CLK gate circuit 210 includes a first AND circuit 2102 receiving signals CLK and PE1 for providing a drive clock signal PH1, and a second AND circuit 2104 receiving signals /CLK and PE1 for providing a drive clock signal /PH1.

Therefore, CLK gate circuit 210 provides the input clock signals CLK and /CLK as drive clock signals PH1 and /PH1 only during activation (H level) of signal PE1.

Drive clock signals PH1 and /PH1 maintain the L level during the inactivation period of signal PE1.

Figure 6:
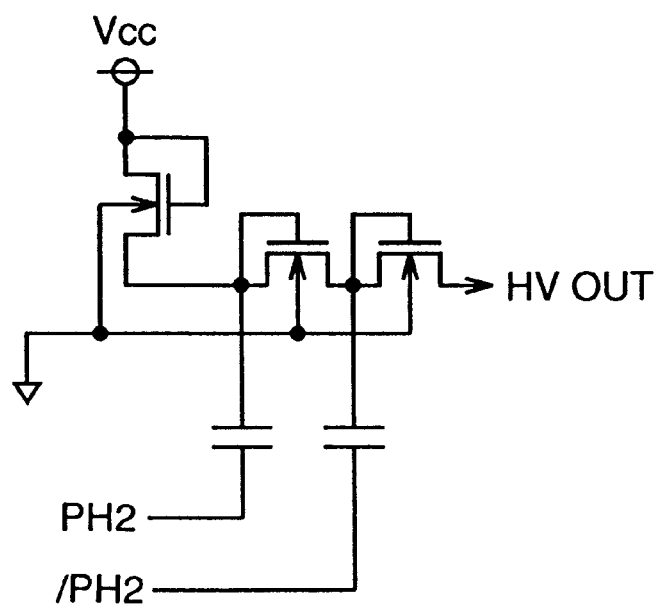
FIG. 6 is a circuit diagram showing a structure of a second charge pump circuit 216.

FIG. 6 is a schematic block diagram showing the structure of charge pump circuit 216 of FIG. 2.

As described with reference to FIG. 2, first charge pump circuit 214 has a structure similar to that of the conventional charge pump circuit 2000.

However, first charge pump circuit 214 has 7 stages of diode-connected transistors driven by drive clock signals PH1 and /PH1 via coupling capacitors C1–C6, whereas second charge pump circuit 216 has 3 stages of diode-connected transistors.

Therefore, the amount of supply current of second charge pump circuit 216 has a value smaller than that of first charge pump circuit 214 according to equation (2).

Figure 7:
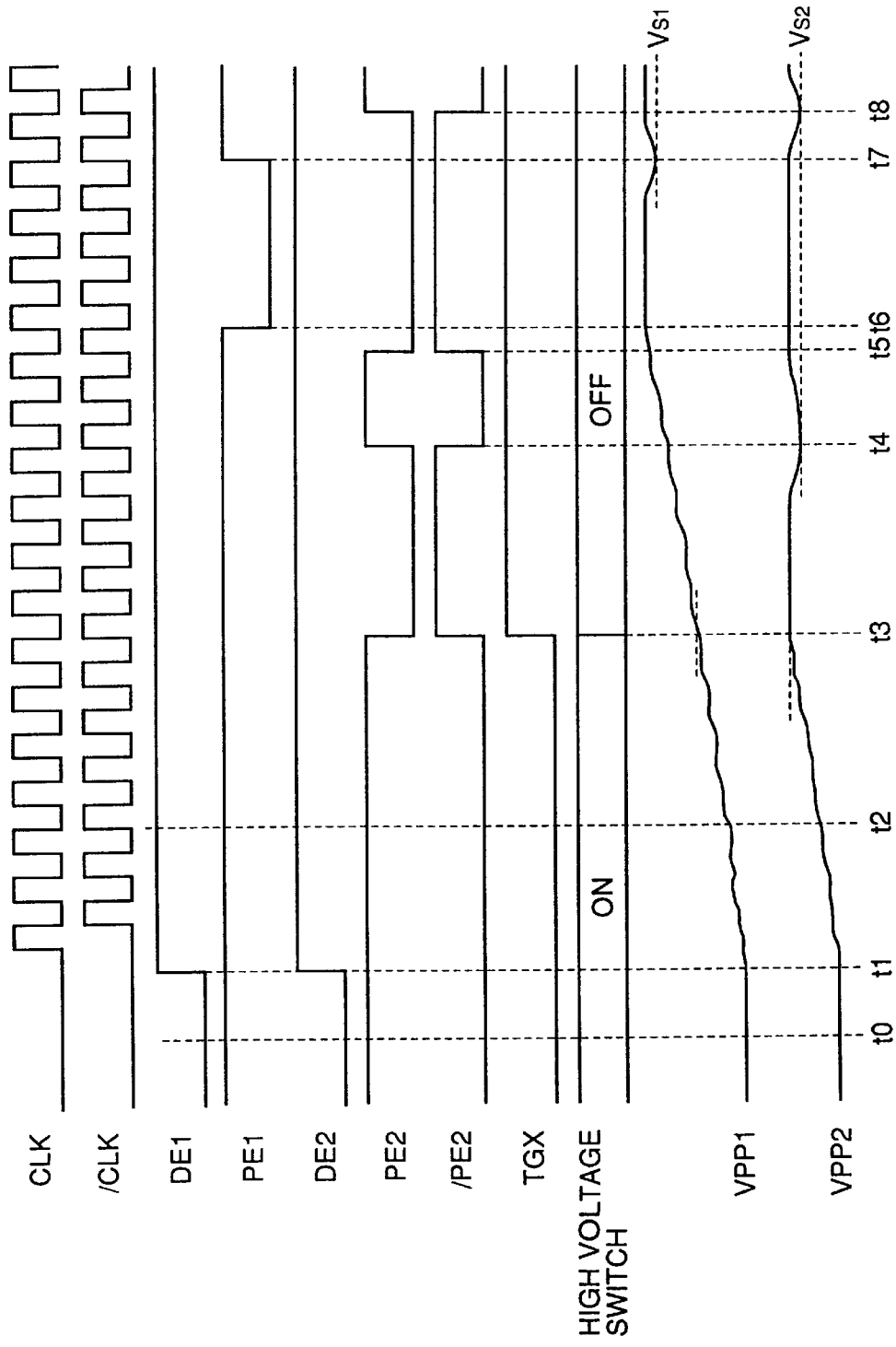
FIG. 7 is a timing chart for describing an operation of high voltage generation circuit 200 of the first embodiment.

FIG. 7 is a timing chart for describing an operation of high voltage generation circuit 200 of FIG. 2.

It is assumed that detection circuit activation signals DE1 and DE2 output from control circuit 122 both attain an L level at time t0. Here, CLK activation signals PE1 and PE2 output from high voltage level detection circuits 206 and 208, respectively, both attain an H level.

As described with reference to FIG. 4, p channel MOS transistor 2188 in high voltage switch circuit 218 attains a conductive state according to the above-described signal levels.

At time t1, signals DE1 and DE2 are both driven to an active state (H level).

In response, clock generation circuit 220 begins to output clock signals CLK and /CLK.

First and second charge pump circuits 214 and 216 respond to drive clock signals PH1, /PH1 and PH2, /PH2 applied to CLK gate circuits 210 and 212, respectively, to boost the potential level of corresponding output nodes $N_{H1}$ and $N_{H2}$. It is to be noted that since high voltage switch circuit 218 is conductive, the potential levels of output nodes $N_{H1}$ and $N_{H2}$ are maintained equally.

In other words, first charge pump circuit 214 of a greater amount of supply current governs the drive of the potential levels of output nodes $N_{H1}$ and $N_{H2}$ in this phase.

At time t3, signal /PE2 is driven to an H level in response to high voltage level detection circuit 208 detecting that the potential level of output node $N_{H1}$ (i.e. the potential level of output node $N_{H2}$) has arrived at a predetermined potential level.

In response, signal /TGX output from flip-flop circuit 2182 in high voltage switch circuit 218 is driven to an L level. Signal TGX output from inverter 2184 is driven to an H level.

High voltage switch circuit 218 is cut off under control of these signals TGX and /TGX.

Therefore, from time t3 onward, the potential level of output node $N_{H1}$ and the potential level of output node $N_{H2}$ are controlled independently by first and second boosting circuits 202 and 204, respectively.

Since the level of potential Vpp2 output from output node $N_{H2}$ of second boosting circuit 204 has already arrived at a predetermined potential level at time t3, high voltage level detection circuit 208 provides control of CLK gate circuit 212 according to whether this potential level Vpp2 exceeds a predetermined lower limit potential level.

At time t4 when high voltage level detection circuit 208 detects that potential Vpp2 has become lower than the predetermined lower limit potential level ($V_{S2}$), a CLK activation signal PE2 changes from "L" level to "H" level and high voltage level detection circuit 208 causes drive clock signals PH2 and /PH2 to be output to second charge pump circuit 216 from CLK gate circuit 212 with an active CLK activation signal PE2.

Accordingly, potential Vpp2 begins to rise again. At time t5 when high voltage level detection circuit 208 detects that potential Vpp2 has arrived at the level of the predetermined potential level, signal PE2 is rendered inactive, whereby supply of the drive clock signal to second charge pump circuit 216 is suppressed.

In a similar manner, second boosting circuit 204 is controlled so that potential Vpp2 maintains a predetermined potential level.

It is noted that since the potential level Vpp1 of output node $N_{H1}$ of first boosting circuit 202 has not arrived at the predetermined potential level in the phase of time t3, CLK activation signal PE1 output from high voltage level detection circuit 206 maintains an active state even after t3.

When high voltage level detection circuit 206 detects that potential Vpp1 has arrived at the predetermined potential level at time t6, CLK activation signal PE1 is rendered inactive.

In response, the operation of first charge pump circuit 214 is inhibited. This causes the level of potential Vpp1 to gradually be reduced. When high voltage level detection circuit 206 detects that potential Vpp1 becomes lower than the predetermined lower limit level ($V_{S1}$) at time t7, CLK activation signal PE1 is rendered active.

In response, first charge pump circuit 214 initiates operation, whereby potential Vpp1 rises to at least the predetermined potential level. Thereafter, the level of potential Vpp1 output from first boosting circuit 202 is maintained at the predetermined value under control of high voltage level detection circuit 206.

By the above-described operation in the high voltage generation circuit of the first embodiment, the rise of potential level Vpp2 output from second boosting circuit 204 can be set equal to the rise of first boosting circuit 202 even when the amount of supply current of second charge pump circuit 216 is small, i.e. the circuit area of second charge pump circuit 216 is small.

Since second charge pump circuit 216 requires only the amount of current supply for maintaining potential Vpp2 at a predetermined potential level, increase in the circuit area can be suppressed even when high voltage generation circuit 200 provides first and second high voltage outputs Vpp1 and Vpp2 in comparison to the case where potentials Vpp1 and Vpp2 are generated by completely independent boosting circuits.

The present invention is not limited to the above-described embodiment where two types of high voltages are output from high voltage generation circuit 200. The present invention is applicable to the case where more high voltages should be output.

SECOND EMBODIMENT

Figure 9:
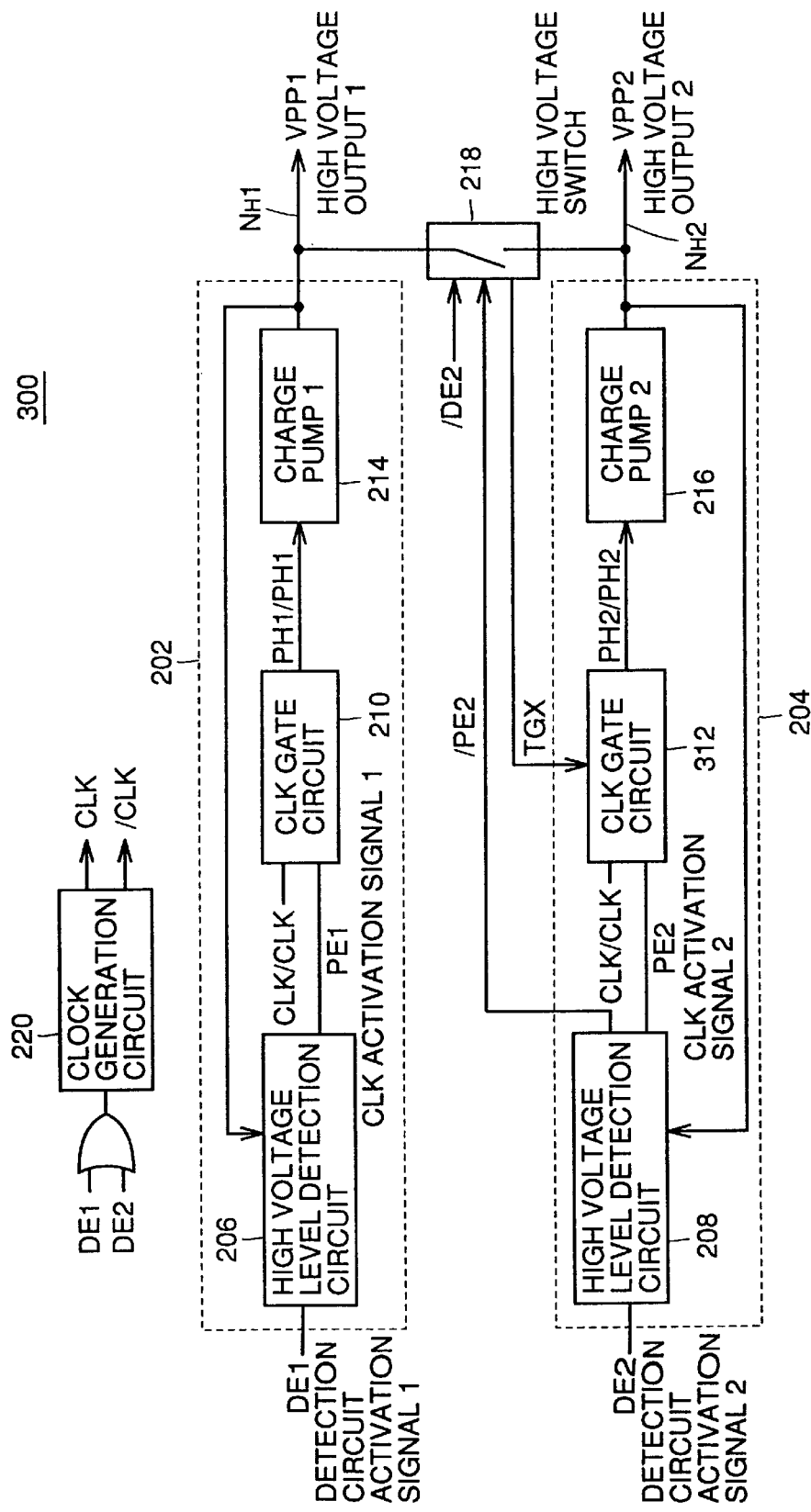
FIG. 9 is a schematic block diagram showing a structure of a high voltage generation circuit 300 of the second embodiment.

FIG. 9 shows a structure of a high voltage generation circuit 300 according to a second embodiment of the present invention.

High voltage generation circuit 300 of the second embodiment differs from high voltage generation circuit 200 of the first embodiment in that a CLK gate circuit 312 in second boosting circuit 204 operates under control of a signal TGX generated in high voltage switch 218 and CLK activation signal PE2.

The remaining elements are similar to those of high voltage generation circuit 200 of the first embodiment shown in FIG. 2. Corresponding components have the same reference characters allotted, and their description will not be repeated.

Figure 8:
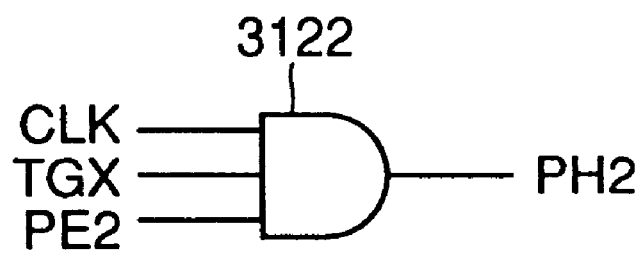
FIG. 8 is a schematic block diagram showing a structure of a CLK gate circuit 312 according to a second embodiment of the present invention.
Figure 8:
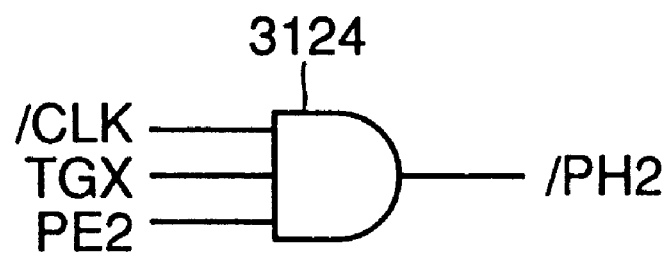

FIG. 8 is a circuit diagram showing a structure of CLK gate circuit 312 of FIG. 9.

CLK gate circuit 312 includes an AND circuit 3122 receiving clock signal CLK, signal TGX and signal PE2 for providing a first drive clock signal PH2, and an AND circuit 3124 receiving clock signal /CLK, signal TGX and signal PE2 for providing a second drive clock signal /PH2.

Therefore, CLK gate circuit 312 provides first and second drive clock signal PH2 and /PH2 according to clock signals CLK and /CLK only during the period where both signals TGX and PE2 attain an active state (H level).

Figure 10:
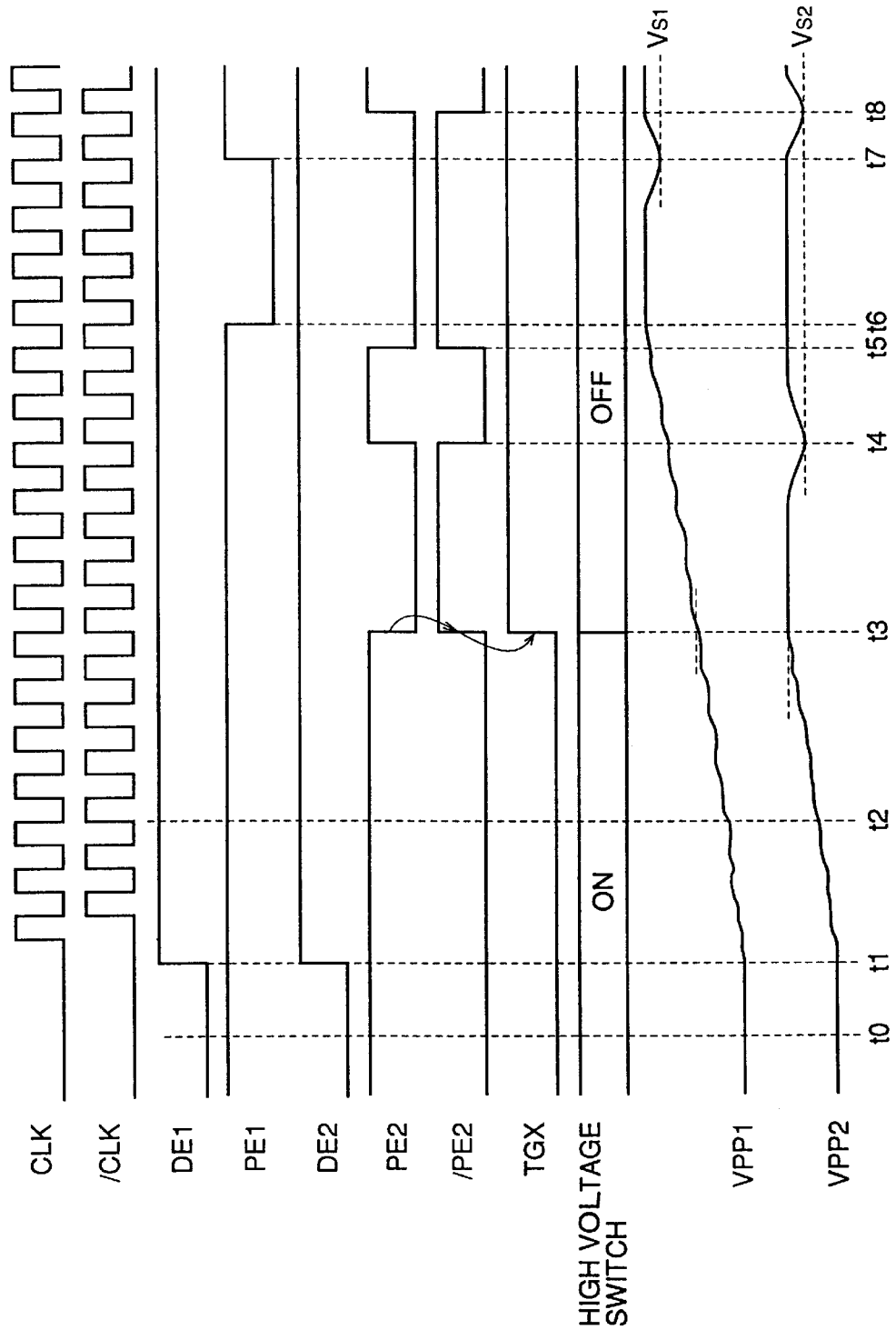
FIG. 10 is a timing chart for describing an operation of high voltage generation circuit 300 of the second embodiment.

FIG. 10 is a timing chart for describing an operation of high voltage generation circuit 300 of FIG. 9.

At time t0, detection circuit activation signals DE1 and DE2 output from control circuit 122 are both inactive. At time t1, signals DE1 and DE2 are driven to an active state (H level). At time t0, signal PE2 attains an active state and signal /PE2 attains an L level. Signal /DE2 attains an H level. Therefore, high voltage switch 218 shown in FIG. 9 conducts.

At time t1, high voltage switch 218 maintains the conducting state even when signal DE2 is driven to an H level, i.e., signal /DE2 is driven to an L level.

More specifically, signal TGX output from high voltage switch 218 attains an L level. Therefore, active drive clock signals PH2 and /PH2 are not output from CLK gate circuit 312. Thus, second charge pump circuit 216 is still inhibited of an operation.

During the period of time t1 to time t3, only first charge pump circuit 214 operates. The potentials of output nodes $N_{H1}$ and $N_{H2}$ of first and second boosting circuits 202 and 204, respectively, are driven by only first charge pump circuit 214.

At time t3 when the potential of node $N_{H2}$ attains a predetermined potential level, high voltage level detection circuit 208 drives the potential of signal PE2 to an L level. In response, signal /PE2 input to high voltage switch circuit 218 is pulled up to an H level, whereby high voltage switch circuit 218 is cut off. The transition of signal /PE2 to an H level also causes signal TGX to be driven to an H level.

Although signal TGX attains an H level in CLK gate circuit 312, signal PE2 attains an L level. Therefore, drive clock signals PH2 and /PH2 are still not supplied to second charge pump circuits 216.

At time t4 when high voltage level detection circuit 208 detects that the potential of node $N_{H2}$, i.e., the level of potential Vpp2, is below a predetermined lower limit potential level ($V_{S1}$), high voltage level detection circuit 208 drives signal PE2 active. At this time point, signals PE2 and TGX are both pulled up to an H level. Therefore, active drive clock signals PH2 and /PH2 are supplied to second charge pump circuit 216 from CLK gate circuit 312.

In response, potential Vpp2 is driven independently by second charge pump circuit 216 to be boosted again to the level of the predetermined potential level. At time t5 when high voltage level detection circuit 208 detects that potential Vpp2 attains the predetermined potential level, signal PE2 is rendered inactive. In response, supply of the drive clock signal to second charge pump circuit 216 is suppressed.

Similarly thereafter, potential Vpp2 is controlled independently by second boosting circuit 204.

At time t3 when high voltage switch circuit 218 is cut off, potential Vpp1 output from first boosting circuit 202 has not yet arrived at the predetermined potential level. Therefore, high voltage level detection circuit 206 maintains signal PE1 at the active state (H level). Therefore, first charge pump circuit 214 continues a boosting operation with independent control of potential Vpp1.

At time t6 when high voltage level detection circuit 206 detects that potential Vpp1 arrives at the predetermined potential level, signal PE1 is rendered inactive.

In response, supply of drive clock signals PH1 and /PH1 to first charge pump circuit 214 is suppressed. At time t7 when high voltage level detection circuit 206 detects that potential Vpp1 has become lower than the first predetermined lower limit potential level ($V_{S1}$), signal PE1 is rendered active ("H" level) again. Therefore, a boosting operation of potential Vpp1 by first charge pump circuit 214 is carried out.

The potentials of output nodes $N_{H1}$ and $N_{H2}$ from which potentials Vpp1 and Vpp2 are supplied, respectively, are both driven by first charge pump circuit 214 at the initial stage of the boosting operation.

Second charge pump circuit 216 only has to maintain the potential of Vpp2 boosted to the second predetermined potential level. Therefore, even if the amount of supply current of second charge pump circuit 216 is set smaller than that of first charge pump circuit 214, i.e. the circuit area of second charge pump circuit 216 is set smaller than that of first charge pump circuit 214, the potential level of node $N_{H2}$ can be raised similar to that of node $N_{H1}$ at the initial stage of the boosting operation.

THIRD EMBODIMENT

Figure 11:
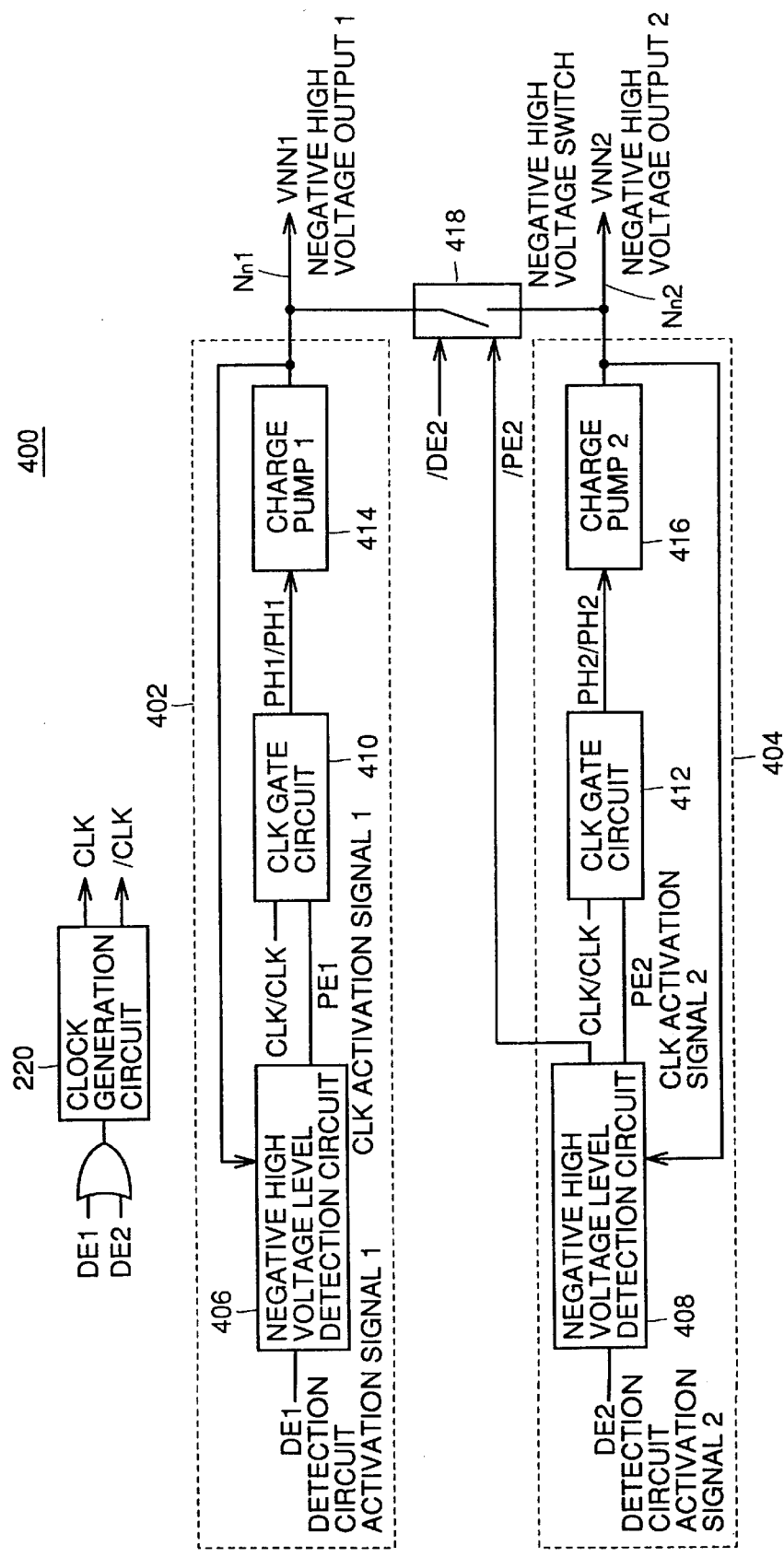
FIG. 11 is a schematic block diagram showing a structure of a negative voltage generation circuit 400 of the third embodiment.

FIG. 11 shows a structure of negative voltage generation circuit 400 of FIG. 1.

Negative voltage generation circuit 400 of the third embodiment differs from high voltage generation circuit 200 of the first embodiment shown in FIG. 2 in the following points.

Negative voltage generation circuit 400 includes a first negative potential drive circuit 402, a second negative potential drive circuit 404, a negative high voltage switch 418, and a clock generation circuit 220.

First negative potential drive circuit 402 has the potential level of its output node Nn1 controlled by control circuit 122 to be driven to a negative high voltage (for example, -10V). Second negative potential drive circuit 404 drives the potential of output node Nn1 to a negative high potential level. Here, the amount of supply current of second negative potential drive circuit 404 is set smaller than the amount of supply current of first negative potential drive circuit 402. High voltage switch 418 is controlled by control circuit 122 and by the potential level of output node Nn1 to open/close the connection between nodes Nn1 and Nn2.

More specifically, negative voltage generation circuit 400 differs in structure from high voltage generation circuit 200 in that first and second negative potential drive circuits 402 and 404 both drive the potential level of the output nodes negative, and that high voltage switch circuit 418 opens/closes the connection of the two output nodes Nn1 and Nn2 which attain a negative potential level.

First negative potential drive circuit 402 includes a high voltage level detection circuit 406 activated in response to a detection circuit activation signal DE1 from control circuit 122 to render CLK activation signal PE1 active upon detecting that the potential level of output node Nn1 attains at least a predetermined potential level, a CLK gate circuit 410 activated according to signal PE1, and receiving clock signals CLK and /CLK for providing drive clock signals PH1 and /PH1, and a charge pump circuit 414 for driving the level of output node Nn1 to a negative potential at the first current supply amount according to drive clock signals PH1 and /PH1.

Second negative potential drive circuit 404 includes a high voltage level detection circuit 408 activated in response to detection circuit activation signal DE2 from control circuit 122 for rendering CLK activation signal PE2 active when the potential level of output node Nn2 is higher than a second predetermined potential, a CLK gate circuit 412 activated in response to signal PE2 for receiving clock signals CLK and /CLK and providing drive clock signals PH2 and /PH2, and a second charge pump circuit 416 driven according to signals PH2 and /PH2 for driving the potential level of output node Nn2 at the second predetermined supply current amount.

Signal /PE2 which is an inverted version of signal PE2 is output from negative high voltage level detection circuit 406. High voltage switch circuit 418 is switched between a conductive state and a cutoff state under control of signal /DE2 which is an inverted version of detection circuit activation signal DE2 and signal /PE2.

Figure 12:
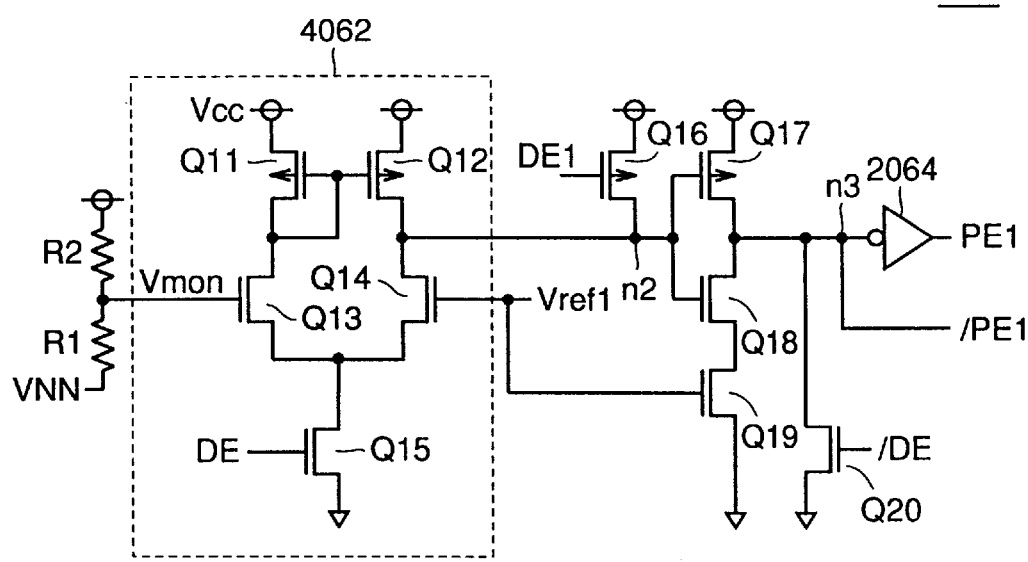
FIG. 12 is a circuit diagram showing a structure of a high voltage level detection circuit 406.

FIG. 12 is a circuit diagram showing a structure of negative high voltage level detection circuit 406 of FIG. 11, and is comparative with FIG. 3.

The structure of high voltage level detection circuit 408 is basically similar to that of high voltage level detection circuit 406 of FIG. 12, provided that the input and output signals and the level of the reference potential differ.

High voltage level detection circuit 406 of FIG. 12 differs in structure from high voltage level detection circuit 206 of FIG. 13 in the following two points.

First, node n1 that provides Vmon which is the input signal of differential amplifier circuit 4062 corresponds to the connection node of resistors R1 and R2 connected in series between power supply potential Vcc and potential Vnn1.

Second, the potential of output node N2 of differential amplifier circuit 4062 is driven as set forth in the following with respect to potential Vmon that is input to differential amplifier circuit 4062 and first reference potential Vref1.

When the level of potential Vmon is higher than potential Vref1, the level of node N1 is driven to an H level. When the level of potential Vmon is lower than potential Vref1, the potential of node N2 is driven to an L level.

Therefore, when potential Vmon is higher than potential Vref1, signal PE1 is driven to an H level and signal /PE1 is driven to an L level.

When potential Vmon is lower than reference Vref1, signal PE1 is driven to an L level and signal /PE1 is driven to an H level.

The remaining elements are similar to those of high voltage level detection circuit 206 of FIG. 3. Corresponding components have the same reference characters allotted, and their description will not be repeated.

Figure 13:
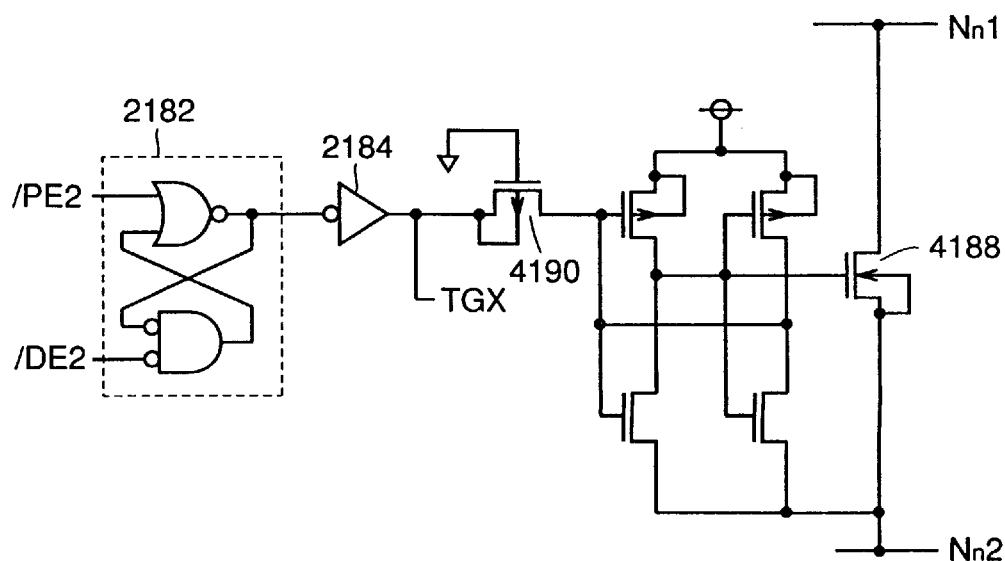
FIG. 13 is a circuit diagram showing a structure of a high voltage switch 418.

FIG. 13 is a circuit diagram showing a structure of high voltage switch circuit 418 of FIG. 11, and is comparative to FIG. 4.

The difference in structure of high voltage switch circuit 418 of FIG. 13 over high voltage switch circuit 218 of FIG. 4 is set forth in the following.

Firstly, high voltage switch circuit 418 includes a p channel MOS transistor 4190 between the output node of inverter 2184 that receives a signal from flip-flop circuit 2182 and provides an inverted version thereof and level shift circuit 4186 for preventing transmission of a potential of a level lower than the ground potential to the output side of inverter 2184.

P channel MOS transistor 4190 is connected between the input node of level shift circuit 4186 and the output node of inverter 2184 for receiving the ground potential at its gate and the output of inverter 2184 at its back gate.

Secondly, level shift circuit 4186 switches between a state providing power supply potential Vcc and the potential level of node $N_{H2}$ according to the signal output from inverter 2184.

Thirdly, the connection of nodes $N_{H1}$ and $N_{H2}$ is closed/opened by n channel MOS transistor 4188.

N channel MOS transistor 4188 is connected between nodes $N_{H1}$ and $N_{H2}$, and receives the output of level shift circuit 4186 at its gate and the potential level of node $N_{H2}$ at its back gate.

High voltage switch circuit 418 renders the connection between nodes $N_{H1}$ and $N_{H2}$ conductive when signals DE2, /DE2, and /PE2 attain an L level, an H level, and an L level, respectively.

This conductive state is maintained even when signal /DE2 is driven to an L level (H level for signal DE2) while signal /PE2 remains at the L level.

In response to signal /PE2 pulled up to an H level while signal /DE2 attains an L level (H level for signal DE2), transistor 4188 is cut off.

Figure 14:
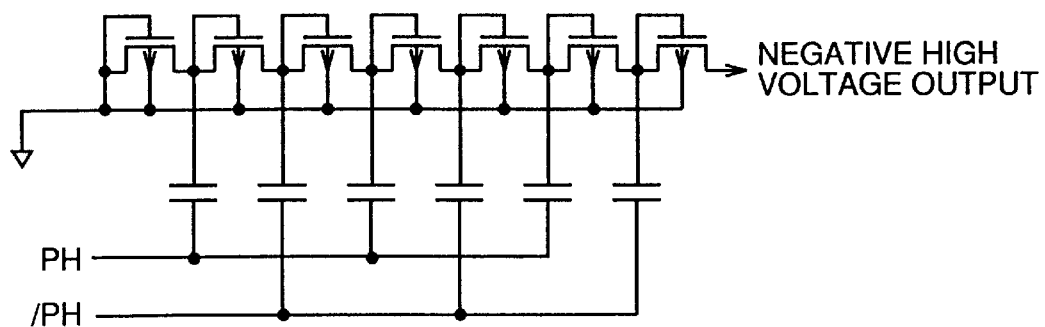
FIGS. 14 and 15 are circuit diagrams showing a structure of a first charge pump circuit 414 and a second charge pump circuit 416, respectively.

FIG. 14 is a diagram showing the structure of first charge pump circuit 414 of negative voltage generation circuit 400 of FIG. 11, and is comparative to FIG. 19.

First charge pump circuit 414 of FIG. 14 differs from the first charge pump circuit 414 of FIG. 19 in that the gate and source of transistor Q1 both receive ground potential. The remaining elements are similar to those of charge pump circuit 2000 of FIG. 19.

Figure 15:
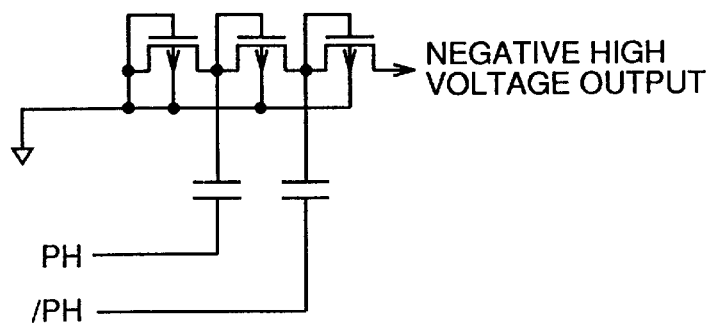

FIG. 15 is a circuit diagram showing a structure of second charge pump circuit 416 of negative voltage generation circuit 400 of FIG. 11.

Second charge pump circuit 416 of FIG. 15 differs from first charge pump circuit 414 of FIG. 14 in that first charge pump circuit 414 includes 7 stages of diode-connected transistors in series, whereas second charge pump circuit 416 includes 3 stages of diode-connected transistors in series.

Therefore, there are six coupling capacitors C1–C6 in the charge pump circuit of FIG. 14 whereas there are only two coupling transistors C1' and C2' in the second charge pump circuit 416 shown in FIG. 15. According to equation (2), the amount of supply current of second charge pump circuit 416 has a smaller value than that of first charge pump circuit 414.

Figure 16:
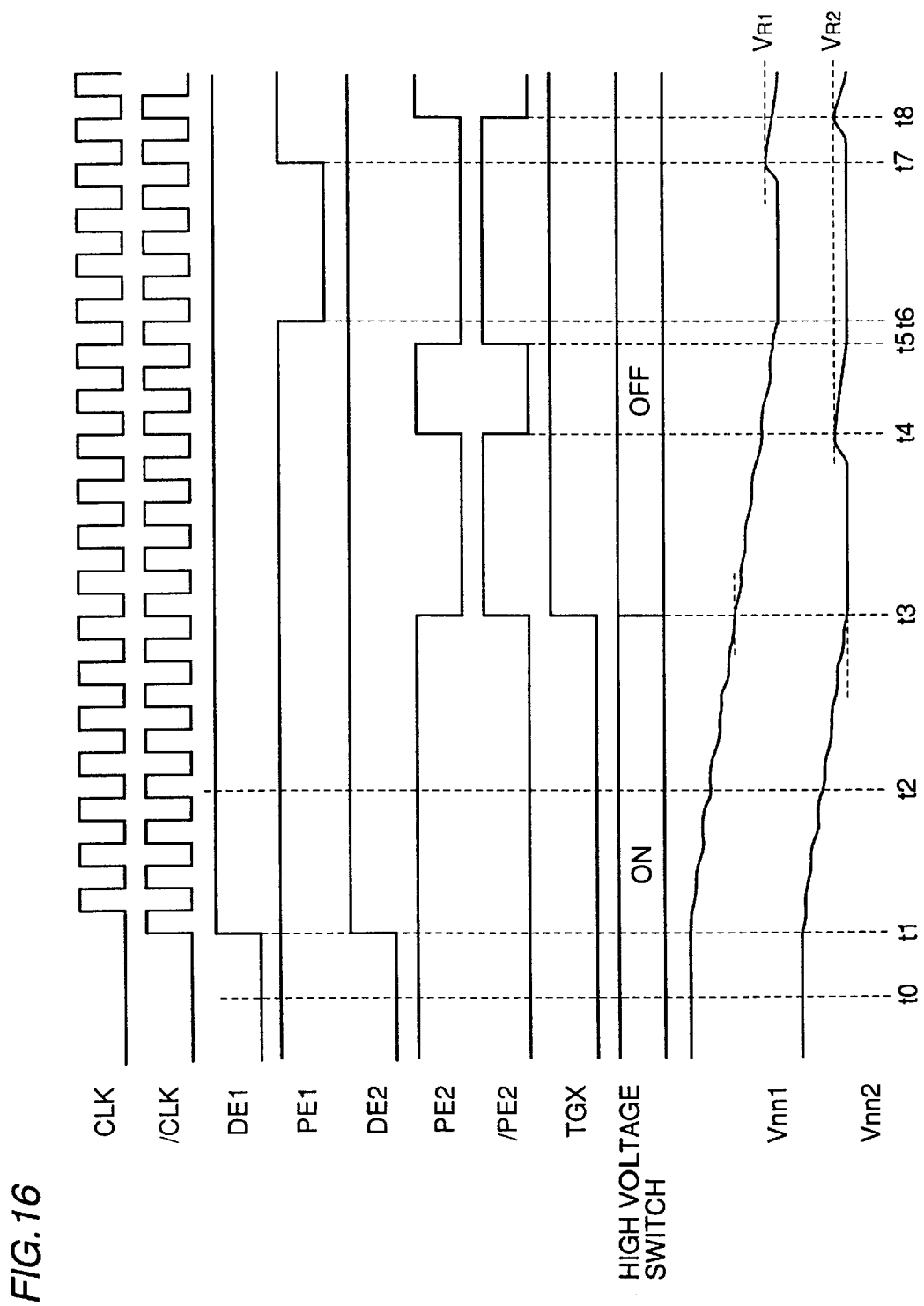
FIG. 16 is a timing chart for describing an operation of a negative voltage generation circuit 400 according to a third embodiment of the present invention.

FIG. 16 is a timing chart for describing an operation of negative voltage generation circuit 400 of FIG. 11.

It is assumed that detection circuit activation signals DE1 and DE2 output from control circuit 122 both attain an L level at time t0. Here, CLK activation signals PE1 and PE2 output from high voltage level detection circuits 406 and 408, respectively, both attain an H level.

In the case where the levels of the signals are as described above, n channel MOS transistor 4188 in high voltage switch circuit 418 attains a conductive state as described with reference to FIG. 13.

At time t1, signals DE1 and DE2 are both driven to an active state (H level).

First and second charge pump circuits 414 and 416 respond to drive clock signals PH1, /PH1 and PH2, /PH2 from CLK gate circuits 410 and 412, respectively, to raise the potential levels of corresponding output nodes Nn1 and Nn2. It is to be noted that the potential levels of output nodes Nn1 and Nn2 are maintained equally since high voltage switch circuit 418 conducts.

At the present stage, first charge pump circuit 414 of a greater amount of supply current governs the drive of the potential levels of output nodes Nn1 and Nn2.

At time t3 when high voltage level detection circuit 408 detects that the potential level of output node Nn1 (i.e., the potential level of output node Nn2) has arrived at a predetermined potential level, signal /PE2 is pulled up to an H level.

In response, signal TGX output from inverter 2184 receiving a signal from flip-flop circuit 2182 in high voltage switch circuit 418 is driven to an H level.

Under control of signal TGX, high voltage switch circuit 418 is cut off.

Thus, the potential levels of output nodes Nn1 and Nn2 are controlled independently by first and second negative potential drive circuits 402 and 404, respectively, after time t3.

This is because, since the level of potential Vnn2 from output node Nn2 of second negative potential drive circuit 404 has already reached the predetermined potential level at time t3, CLK gate circuit 412 is driven under control of high voltage level detection circuit 408 according to whether potential Vnn2 is below a predetermined upper limit potential level ($V_{R2}$).

In general, the potential level of node Nn2 gradually increases after the inactivation of charge pump circuit 416 owing to a very slight leakage current.

For example, when high voltage level detection circuit 408 detects that potential Vnn2 has become higher than the predetermined upper limit potential level ($V_{R2}$) at time t4, a CLK activation signal PE2 changes from "L" level to "H" level and high voltage level detection circuit 408 provides drive clock signals PH2 and /PH2 from CLK gate circuit 412 to second charge pump circuit 416 with an active CLK activation signal PE2.

This causes the level of potential Vnn2 to be reduced again. When high voltage level detection circuit 408 detects that potential Vnn2 has become lower than the predetermined potential level at time t5, signal PE2 is rendered inactive, whereby supply of drive clock signals to second charge pump circuit 416 is suppressed.

Thus, second negative potential drive circuit 204 is controlled so that potential Vnn2 maintains a predetermined potential level thereafter.

At the time point of t3, potential Vnn1 of output node Nn1 of first potential drive circuit 202 has not arrived at the predetermined potential level. Therefore, CLK activation signal PE1 output from high voltage level detection circuit 406 maintains an active state even after time t3. When high voltage level detection circuit 406 detects that potential Vnn1 has arrived at a predetermined potential level at time t6, CLK activation signal PE1 is rendered inactive.

In response, the operation of first charge pump circuit 414 is suppressed. The level of potential Vnn1 gradually begins to rise due to the suppression of first charge pump circuit 414. At time t7 when high voltage level detection circuit 406 detects that potential Vnn1 has become higher than the predetermined upper limit level ($V_{R1}$), CLK activation signal PE1 is rendered active.

Accordingly, first charge pump circuit 414 operates again, whereby potential Vnn1 reduces to at least the predetermined potential level. Thus, the level of potential Vnn1 output from first negative potential drive circuit 402 is maintained at a predetermined level under control of high voltage level detection circuit 406.

According to the above-described operation in the high voltage generation circuit of the third embodiment, the fall of potential level Vnn2 output from second negative potential drive circuit 404 can be set identical to that of first negative potential drive circuit 402 even when the amount of supply current of second charge pump circuit 416 is small, i.e., even when the circuit area of second charge pump circuit 416 is small.

Second charge pump circuit 416 requires an amount of current supply for only maintaining potential Vnn2 at the predetermined potential level. Therefore, increase in the circuit area can be suppressed even when negative voltage generation circuit 400 provides a first high voltage output Vnn1 and a second high voltage output Vnn2 in comparison to the case where potentials Vnn1 and Vnn2 are generated by completely independent negative potential drive circuits.

The present invention is not limited to negative voltage generation circuit 400 from which only two types of high voltages are provided. The present invention is applicable to the case where more types of high voltages are output.

FOURTH EMBODIMENT

Figure 17:
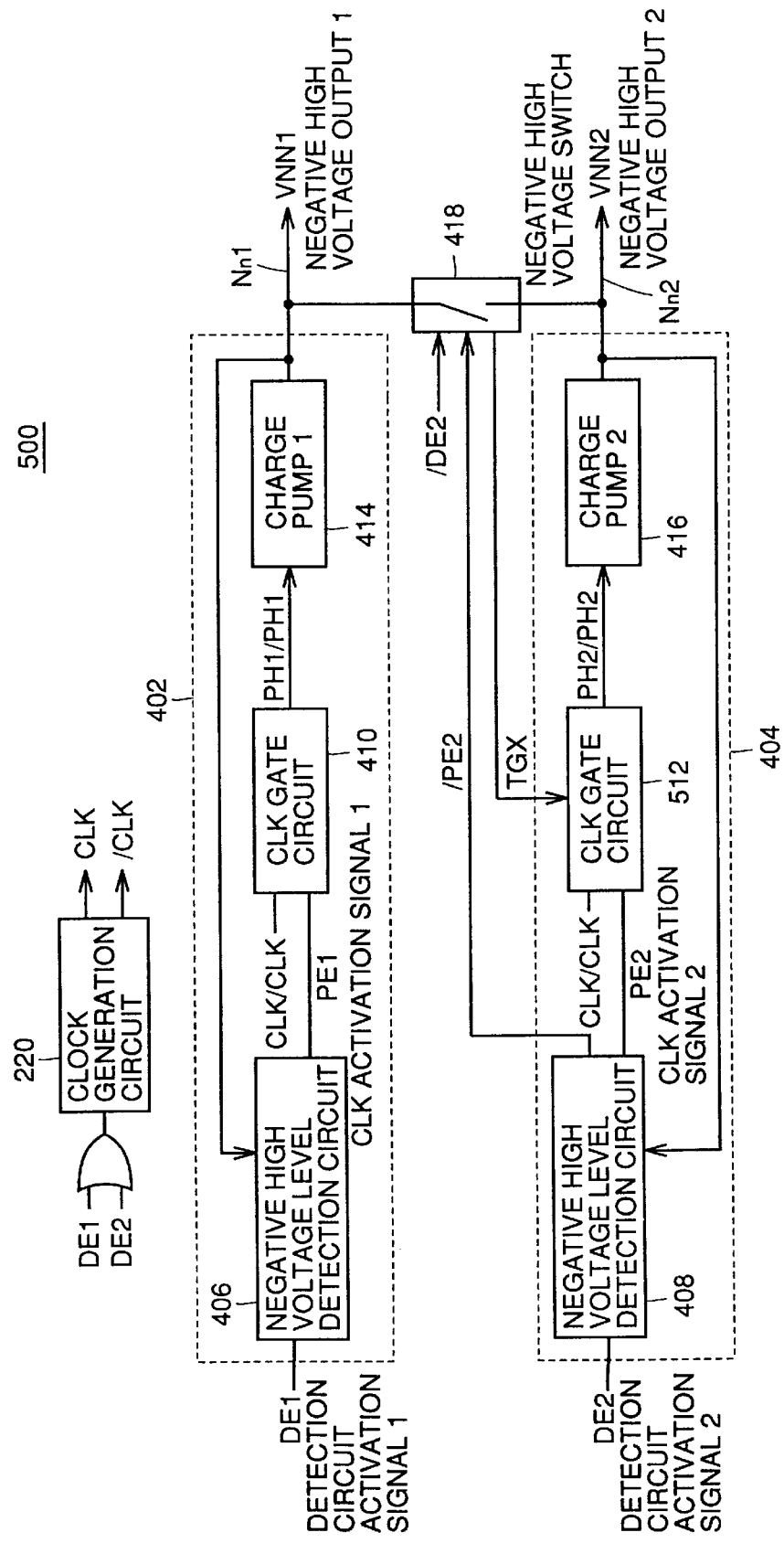
FIG. 17 is a schematic block diagram showing a structure of a negative voltage generation circuit 500 according to a fourth embodiment of the present invention.

FIG. 17 is a block diagram showing a structure of negative voltage generation circuit 500 according to a fourth embodiment of the present invention.

The difference of negative voltage generation circuit 500 of the fourth embodiment over the negative voltage generation circuit of the third embodiment shown in FIG. 11 is set forth in the following.

In negative voltage generation circuit 500 of the fourth embodiment, a CLK gate circuit 512 in a second negative potential drive circuit 404 is operated under control of CLK activation signal PE2 from high voltage level detection circuit 408 and signal TGX from high voltage switch 418.

More specifically, similar to the structure of CLK gate circuit 312 of the second embodiment shown in FIG. 8, CLK gate circuit 512 provides clock signals CLK and /CLK from clock generation circuit 220 as drive clock signals PH2 and /PH2 only during the period where signals TGX and PE2 are both active (H level).

At the initial stage of operation of negative voltage generation circuit 500, high voltage switch 418 attains a conductive state, and CLK gate circuit 512 does not output active drive clock signals PH2 and /PH2.

Therefore, second charge pump circuit 416 will not operated until output node Nn2 attains a predetermined potential level.

The remaining elements are similar to those of negative voltage generation circuit 400 of the third embodiment shown in FIG. 11. Corresponding components have the same reference characters allotted, and their description will not be repeated.

Figure 18:
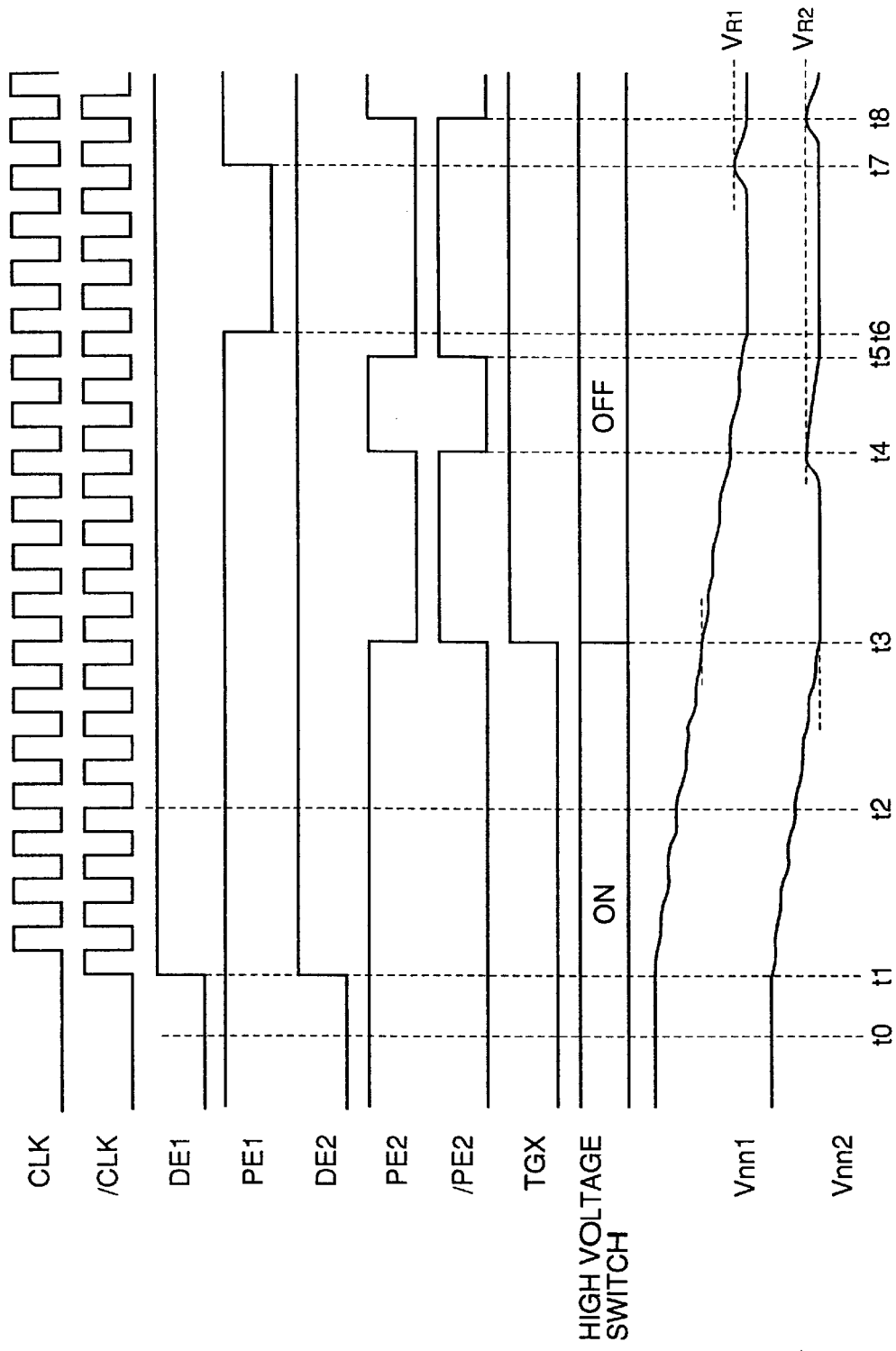
FIG. 18 is a timing chart for describing an operation of negative voltage generation circuit 500.

FIG. 18 is a timing chart for describing an operation of negative voltage generation circuit 500 of FIG. 17.

At time t0, detection circuit activation signals DE1 and DE2 from control circuit 122 are both inactive. At time t1, signals DE1 and DE2 are driven to an active state (H level). Signals PE2 and /PE2 attain an active state and an L level, respectively, at time t0. High voltage switch 418 of FIG. 17 conducts since signal /DE2 attains an H level.

High voltage switch 418 maintains the conducting state even when signal DE2 is driven to an H level, i.e., signal /DE2 is driven to an L level at time t1.

More specifically, signal TGX output from high voltage switch 418 attains an L level. Therefore, active drive clock signals PH2 and /PH2 are not output from CLK gate circuit 412. Thus, second charge pump circuit 216 still has its operation suppressed.

During the period of time t1 to time t3, only first charge pump circuit 414 operates. The potential levels of output nodes Nn1 of first negative potential drive circuit 402 and output node Nn2 of second negative potential drive circuit 404 is driven only by first charge pump circuit 414.

At time t3 when the potential level of node Nn2 attains a predetermined potential level, high voltage level detection circuit 408 drives the potential level of signal PE2 to an L level. In response, signal /PE2 applied to high voltage switch circuit 418 is pulled up to an H level, whereby high voltage switch circuit 418 is cut off. Also, in response to transition of signal /PE2 to an H level, signal TGH is pulled up to an H level.

Although signal TGX attains an H level in CLK gate circuit 512, signal PE2 attains an L level. Therefore, drive clock signals PH2 and /PH2 are still not supplied to second charge pump circuit 416.

At time t4 when high voltage level detection circuit 408 detects that the potential level of node Nn2, i.e., the potential Vnn2, has arrived at a predetermined upper limit potential level, high voltage level detection circuit 408 drives signal PE2 to an active state. At this time point, signals PE2 and TGX are both driven to an H level. Therefore, active drive clock signals PH2 and /PH2 are supplied to second charge pump circuit 416 from CLK gate circuit 512.

Potential Vnn2 is driven independently by second charge pump circuit 416 to fall again to the predetermined potential level. At time t5 when high voltage level detection circuit 408 detects that potential Vnn2 has become lower than the predetermined potential level, signal PE2 is rendered inactive. In response, supply of drive clock signals to second charge pump circuit 416 is suppressed.

Thus, potential Vnn2 is controlled independently by second negative potential drive circuit 404 in a similar manner thereafter.

At the time point of t3 when high voltage switch circuit 418 is cut off, potential Vnn1 output from first negative potential drive circuit 402 has not arrived at the predetermined potential level set for potential Vnn1. Therefore, high voltage level detection circuit 406 maintains signal PE1 at an active state (H level). Therefore, first charge pump circuit 414 controls potential Vnn1 independently to continue the voltage-down operation.

At time t6 when high voltage level detection circuit 406 detects that potential Vnn1 has arrived at a predetermined potential level, signal PE1 is driven to an inactive state.

In response, supply of drive clock signals PH1 and /PH1 to first charge pump circuit 414 is suppressed. At time t7 when high voltage level detection circuit 406 detects that the level of potential Vnn1 has become higher than a first predetermined upper limit potential level, signal PE1 is rendered active again, whereby the voltage-down operation of potential Vnn1 by first charge pump circuit 414 is carried out.

In negative potential drive circuit 500 of the fourth embodiment, the potentials of output node Nn1 from which potential Vnn1 is supplied and output node Nn2 from which potential Vnn2 is supplied are both driven by first charge pump circuit 414 at the initial stage of the voltage-down operation.

Second charge pump circuit 416 only has to carry out the operation of maintaining potential Vnn2 reduced to the second predetermined potential level. Therefore, the potential level of node Nn2 can be raised similarly as the potential level of node Nn1 at the initial stage of the voltage-down operation even when the amount of supply current of the second charge pump circuit is smaller than that of the first charge pump circuit, i.e. the circuit area of second charge pump circuit 416 is set smaller than that of first charge pump circuit 414.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An internal potential generation circuit receiving an external power supply potential for generating a first predetermined internal potential and a second predetermined internal potential having an absolute value smaller than the absolute value of said first predetermined internal potential, comprising:
    a clock generation circuit for providing clock signals complementary to each other,
    a first charge pump circuit including a first output node from which said first predetermined internal potential is to be output, for driving potential of said first output node with a first capacity of current supply according to said complementary clock signals,
    a second charge pump circuit including a second output node from which said second predetermined internal potential is to be output, for driving potential of said second output node with a second capacity of current supply smaller than said first capacity of current supply according to said complementary clock signals,
    a switch circuit for setting connection between said first output node and said second output node to any of a conducting state and a cutoff state, and
    a control circuit for controlling supply of said complementary clock signals to said first charge pump circuit and said second charge pump circuit, respectively, according to the potential level of said second output node, said control circuit setting said switch circuit to the cutoff state from the conducting state in response to the potential of said first and second output nodes attaining said second predetermined potential.

2. The internal potential generation circuit according to claim 1, wherein said first and second predetermined internal potentials are both positive potentials,
    wherein said control circuit controls supply of said complementary clock signals to said first charge pump circuit so that the potential level of said first output node attains said first predetermined internal potential, and controls supply of said complementary clock signals to said second charge pump circuit so that the potential level of said second output node attains said second predetermined internal potential after said switch circuit is set to the cutoff state.

3. The internal potential generation circuit according to claim 1, wherein said first predetermined internal potential and said second predetermined internal potential are both positive potentials,
    wherein said control circuit comprises
        a first internal control circuit for controlling supply of said complementary clock signals to said first charge pump circuit so that the potential level of said first output node attains said first predetermined internal potential after said switch circuit is set to the cutoff state, and
        a second internal control circuit for controlling supply of said complementary clock signals to said second charge pump circuit so that the potential level of said second output node attains said second predetermined internal potential after said switch circuit is set to the cutoff state.

4. The internal potential generation circuit according to claim 2, wherein said control circuit initiates supply of said complementary clock signals to both said first and second charge pump circuits according to initiation of an operation of said internal potential generation circuit.

5. The internal potential generation circuit according to claim 3, wherein said second internal control circuit renders an internal control signal inactive in response to the potential level of said second output node attaining at least said second predetermined internal potential,
    wherein said switch circuit comprises
        a latch circuit attaining a set state in response to inactivation of said internal control signal, and attaining a reset state according to suppression of operation of said internal potential generation circuit, and
        a connection circuit for setting connection between said first output node and said second output node to the cutoff state according to said latch circuit attaining the set state.

6. The internal potential generation circuit according to claim 2, wherein said control circuit initiates supply of said complementary clock signals to said first charge pump circuit in response to initiation of an operation of said internal potential generation circuit, and initiating supply of said complementary clock signals to said second charge pump circuit after said switch circuit attains the cutoff state.

7. The internal potential generation circuit according to claim 3, wherein said second internal control circuit comprises
    a potential level detection circuit for rendering an internal control signal inactive in response to the potential level of said second output node attaining at least said second predetermined internal potential, and
    a clock supply control circuit for controlling supply of said complementary clock signals to said second charge pump circuit,
    wherein said switch circuit comprises
        a latch circuit attaining a set state in response to inactivation of said internal control signal, and attaining a reset state in response to suppression of operation of said internal potential generation circuit, and a connection circuit for setting connection between said first output node and said second output node to the cutoff state in response to said latch circuit attaining the set state, wherein said clock supply control circuit initiates supply of said complementary clock signals when said internal control signal is inactive and said latch circuit attains the set state.

8. The internal potential generation circuit according to claim 1, wherein said first predetermined internal potential and said second predetermined internal potential are both negative potentials, wherein said control circuit controls supply of said complementary clock signals to said first charge pump means so that the potential level of said first output node attains said first predetermined internal potential, and controls supply of said complementary clock signals to said second charge pump circuit so that the potential level of said second output node attains said second predetermined internal potential, after said switch circuit attains the cutoff state.

9. The internal potential generation circuit according to claim 1, wherein said first predetermined internal potential and said second predetermined internal potential both are negative potentials, wherein said control circuit comprises first internal control circuit for controlling supply of said complementary clock signals to said first charge pump circuit so that the potential level of said first output node attains said first predetermined internal potential after said switch circuit is set to the cutoff state, and second internal control circuit for controlling supply of said complementary clock signals to said second charge pump circuit so that the potential level of said second output node attains said second predetermined internal potential after said switch circuit is set to the cutoff state.

10. The internal potential generation circuit according to claim 8, wherein said control circuit initiates supply of said complementary clock signals to both said first and second charge pump circuits in response to initiation of an operation of said internal potential generation circuit.

11. The internal potential generation circuit according to claim 9, wherein said second internal control circuit renders an internal control signal inactive in response to the potential level of said second output node becoming lower than said second predetermined internal potential, wherein said switch circuit comprises a latch circuit attaining a set state in response to inactivation of said internal control signal, and attaining a reset state according to suppression of operation of said internal potential generation circuit, and a connection circuit for setting connection between said first output node and said second output node to the cutoff state according to said latch circuit attaining the set state.

12. The internal potential generation circuit according to claim 8, wherein said control circuit initiates supply of said complementary clock signals to said first charge pump circuit in response to initiation of operation of said internal potential generation circuit, and initiating supply of said complementary clock signals to said second charge pump circuit after said switch circuit attains the cutoff state.

13. The internal potential generation circuit according to claim 9, wherein said second internal control circuit comprises a potential level detection circuit for rendering an internal control signal inactive in response to the potential level of said second output node becoming lower than said second predetermined internal potential, a clock supply control circuit for controlling supply of said complementary clock signals to said second charge pump circuit, wherein said switch circuit comprises a latch circuit attaining a set state in response to inactivation of said internal control signal, and attaining a reset state according to suppression of operation of said internal potential generation circuit, and a connection circuit for setting connection of said first output node and said second output node to the cutoff state in response to said latch circuit attaining the set state, wherein said clock supply control circuit initiates supply of said complementary clock signals in response to said internal control signal attaining an active state and said latch circuit attaining the set state.

* * * * *